(12) United States Patent
Skadron et al.

(10) Patent No.: US 12,334,183 B2
(45) Date of Patent: Jun. 17, 2025

(54) MEMORY DEVICES INCLUDING PROCESSING-IN-MEMORY ARCHITECTURE CONFIGURED TO PROVIDE ACCUMULATION DISPATCHING AND HYBRID PARTITIONING

(71) Applicant: UNIVERSITY OF VIRGINIA PATENT FOUNDATION, Charlottesville, VA (US)

(72) Inventors: Kevin Skadron, Charlottesville, VA (US); Marzieh Lenjani, Champaign, IL (US)

(73) Assignee: UNIVERSITY OF VIRGINIA PATENT FOUNDATION, Charlottesville, VA (US)

( * ) Notice: Subject to any disclaimer, the term of this patent is extended or adjusted under 35 U.S.C. 154(b) by 153 days.

(21) Appl. No.: 18/306,531

(22) Filed: Apr. 25, 2023

(65) Prior Publication Data
US 2023/0343373 A1 Oct. 26, 2023

Related U.S. Application Data

(60) Provisional application No. 63/334,844, filed on Apr. 26, 2022.

(51) Int. Cl.
*G11C 7/10* (2006.01)
*G06F 17/16* (2006.01)

(52) U.S. Cl.
CPC ............ *G11C 7/1039* (2013.01); *G06F 17/16* (2013.01); *G11C 7/1057* (2013.01)

(58) Field of Classification Search
CPC ...... G11C 7/1039; G11C 7/1057; G06F 17/16
See application file for complete search history.

(56) References Cited

U.S. PATENT DOCUMENTS

2023/0385562 A1* 11/2023 Lee .......................... G06J 1/00
2024/0143199 A1* 5/2024 Poremba ............. G06F 9/30014

OTHER PUBLICATIONS

Ahn, Junwhan, et al. "A scalable processing-in-memory accelerator for parallel graph processing." Proceedings of the 42nd Annual International Symposium on Computer Architecture. 2015.
(Continued)

*Primary Examiner* — Han Yang
(74) *Attorney, Agent, or Firm* — Stanek Lemon Crouse & Meeks, PA

(57) ABSTRACT

An integrated circuit memory device can include a plurality of banks of memory, each of the banks of memory including a first pair of sub-arrays comprising first and second sub-arrays, the first pair of sub-arrays configured to store data in memory cells of the first pair of sub-arrays, a first row buffer memory circuit located in the integrated circuit memory device adjacent to the first pair of sub-arrays and configured to store first row data received from the first pair of sub-arrays and configured to transfer the row data into and/or out of the first row buffer memory circuit, and a first sub-array level processor circuit in the integrated circuit memory device adjacent to the first pair of sub-arrays and operatively coupled to the first row data, wherein the first sub-array level processor circuit is configured to perform column oriented processing a sparse matrix kernel stored, at least in-part, in the first pair of sub-arrays, with input vector values stored, at least in part, in the first pair of sub-arrays to provide output vector values representing products of values stored in columns of the sparse matrix kernel with the input vector values.

13 Claims, 15 Drawing Sheets

(56) References Cited

OTHER PUBLICATIONS

Challapalle, Nagadastagiri, et al. "GaaS-X: Graph analytics accelerator supporting sparse data representation using crossbar architectures." 2020 ACM/IEEE 47th Annual International Symposium on Computer Architecture (ISCA). IEEE, 2020.

Dai, Guohao, et al. "ForeGraph: Exploring large-scale graph processing on multi-FPGA architecture." Proceedings of the 2017 ACM/SIGDA International Symposium on Field-Programmable Gate Arrays. 2017.

Dai, Guohao, et al. "Graphh: A processing-in-memory architecture for large-scale graph processing." IEEE Transactions on Computer-Aided Design of Integrated Circuits and Systems 38.4 (2018): 640-653.

Gui, Chuang-Yi, et al. "A survey on graph processing accelerators: Challenges and opportunities." Journal of Computer Science and Technology 34 (2019): 339-371.

Hajinazar, Nastaran, et al. "SIMDRAM: a framework for bit-serial SIMD processing using DRAM." Proceedings of the 26th ACM International Conference on Architectural Support for Programming Languages and Operating Systems. 2021.

Ham, Tae Jun, et al. "Graphicionado: A high-performance and energy-efficient accelerator for graph analytics." 2016 49th Annual IEEE/ACM International Symposium on Microarchitecture (MICRO). IEEE, 2016.

He, Mingxuan, et al. "Newton: A DRAM-maker's accelerator-in-memory (AiM) architecture for machine learning." 2020 53rd Annual IEEE/ACM International Symposium on Microarchitecture (Micro). IEEE, 2020.

Kim, Ytong-Bin, and Tom W. Chen. "Assessing merged DRAM/logic technology." Integration 27.2 (1999): 179-194.

Leng, Jingwen, et al. "GPUWattch: Enabling energy optimizations in GPGPUs." ACM SIGARCH Computer Architecture News 41.3 (2013): 487-498.

Lenjani, Marzieh, et al. "Fulcrum: A simplified control and access mechanism toward flexible and practical in-situ accelerators." 2020 IEEE International Symposium on High Performance Computer Architecture (HPCA). IEEE, 2020.

Nai, Lifeng, et al. "Graphpim: Enabling instruction-level pim offloading in graph computing frameworks." 2017 IEEE International symposium on high performance computer architecture (HPCA). IEEE, 2017.

Nurvitadhi, Eriko, et al. "Hardware accelerator for analytics of sparse data." 2016 Design, Automation & Test in Europe Conference & Exhibition (DATE). IEEE, 2016.

Ozdal, Muhammet Mustafa, et al. "Energy efficient architecture for graph analytics accelerators." ACM SIGARCH Computer Architecture News 44.3 (2016): 166-177.

Pal, Subhankar, et al. "Outerspace: An outer product based sparse matrix multiplication accelerator." 2018 IEEE International Symposium on High Performance Computer Architecture (HPCA). IEEE, 2018.

Sadredini, Elaheh, et al. "Sunder: Enabling low-overhead and scalable near-data pattern matching acceleration." MICRO-54: 54th Annual IEEE/ACM International Symposium on Microarchitecture. 2021.

Xie, Xinfeng, et al. "SpaceA: Sparse matrix vector multiplication on processing-in-memory accelerator." 2021 IEEE International Symposium on High-Performance Computer Architecture (HPCA). IEEE, 2021.

Yang, Carl, Yangzihao Wang, and John D. Owens. "Fast sparse matrix and sparse vector multiplication algorithm on the GPU." 2015 IEEE International Parallel and Distributed Processing Symposium Workshop. IEEE, 2015.

Zhou, Minxuan, et al. "Gram: graph processing in a reram-based computational memory." IEEE Asia and South Pacific Design Automation Conference. 2019.

\* cited by examiner

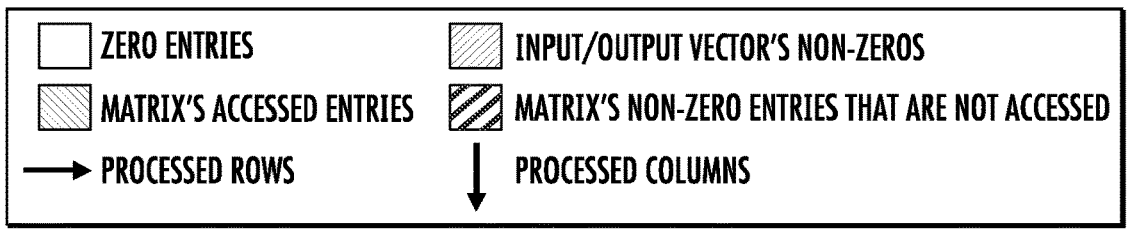
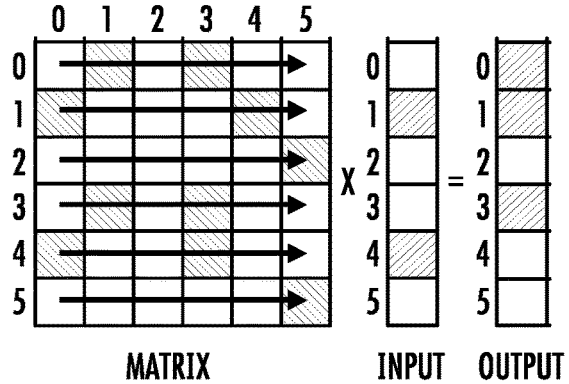
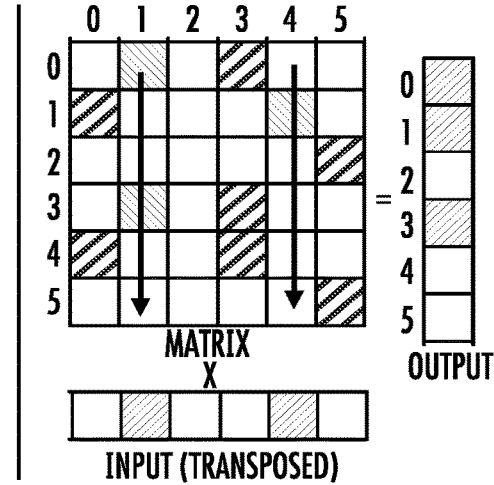
FIG. 1(A)  FIG. 1(B)
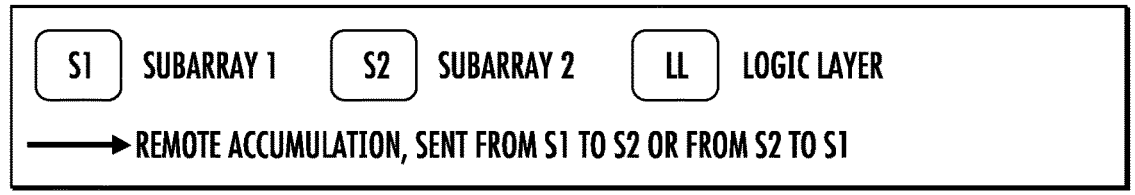
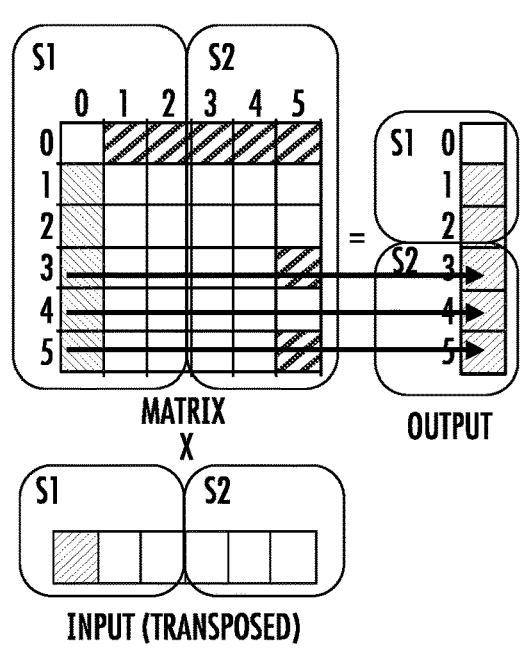
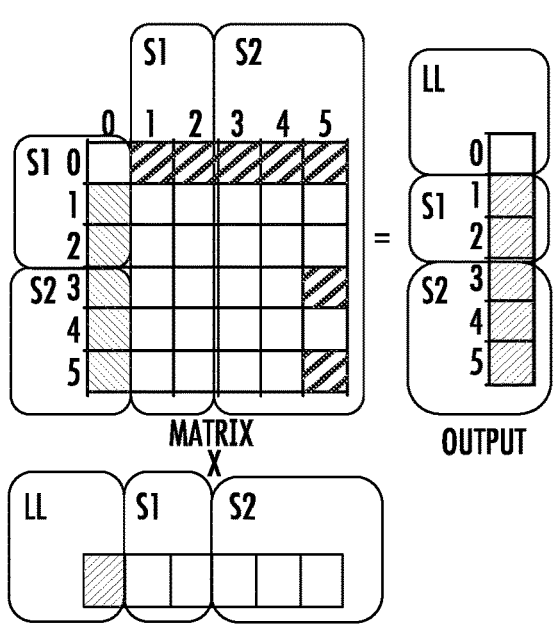
FIG. 2(A)  FIG. 2(B)

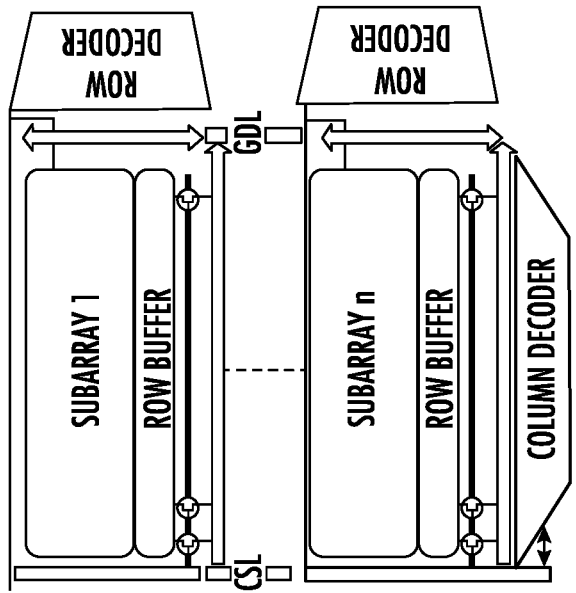
FIG. 3(B)
FIG. 3(A)
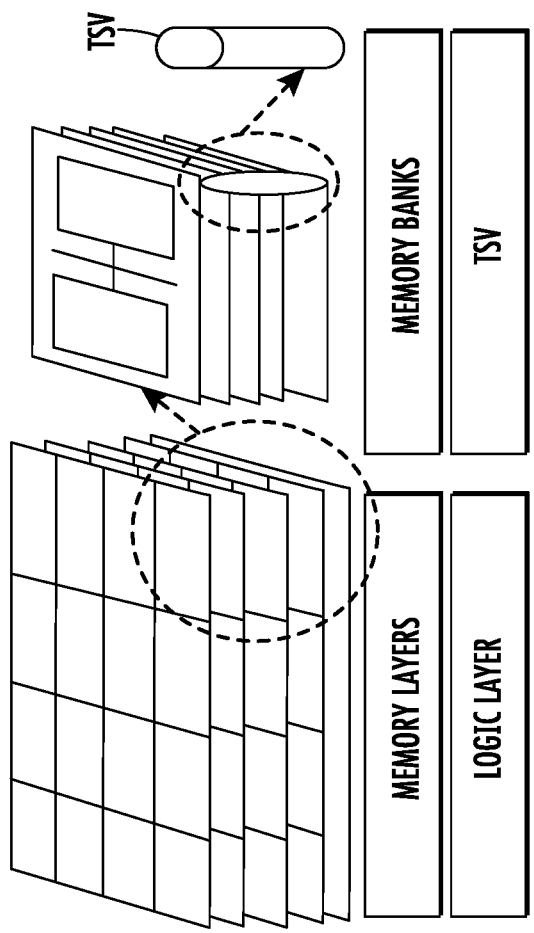
FIG. 4

```
1   INPUT:
2       CSC_OFFSETS [0 :N]
3       CSC_PAIR [0: NUMNONZEROS (MATRIX) *2-1],
4       //PAIR SPARSE FORMAT OF THE INPUT VECTOR
5       CURRFRONTIER [0: NUMNONZEROS (INPUT) *2-1]
6   OUTPUT:
7       OUTPUTDENSE [0 :N-1] =0
8       NUMOUTPUTNONZEROS=0
9       //PAIR SPARSE FORMAT OF THE OUTPUT VECTOR
10      NXTFRONTIER [0 : 2*N-1]
11  //PROCESSING ONLY COLUMNS CORRESPONDING TO NON-ZEROS OF THE INPUT
12  FOR (i=0; i< NUMNONZEROS (INPUT) *2; i+=2) :
13      F_COLUMN= CURRFRONTIER [i]
14      F_VALUE= CURRFRONTIER [i+1]
15      COL_OFFSET= CSC_OFFSETS[F_COLUMN]
16      COL_LENGTH= CSC_OFFSETS[F_COLUMN+1]-CSC_OFFSETS[F_COLUMN]
17      FOR (J=0; J< COL_LENGTH; J+=2) :
18          ROW_INDEX= CSC_PAIR[COL_OFFSET +J] ;
19          ROW_VALUE= CSC_PAIR[COL_OFFSET +J+1]
20          //RANDOM WRITE TO THE OUTPUT VECTOR
21          OUTPUTDENSE [ROW INDEX]+= ROW VALUE * F_VALUE
22  //GENERATING THE SPARSE FORMAT OF THE UPPER VECTOR
23  FOR (i=0; i<N, i++) :
24      IF (OUTPUTDENSE[i] !=0) :
25          t= numoutputnonzeros*2
26          NXTFRONTIER [t] = i
27          NXTFRONTIER [t+1] = OUTPUTDENSE [i]
28          NUMOUTPUTNONZEROS++
```

FIG. 6

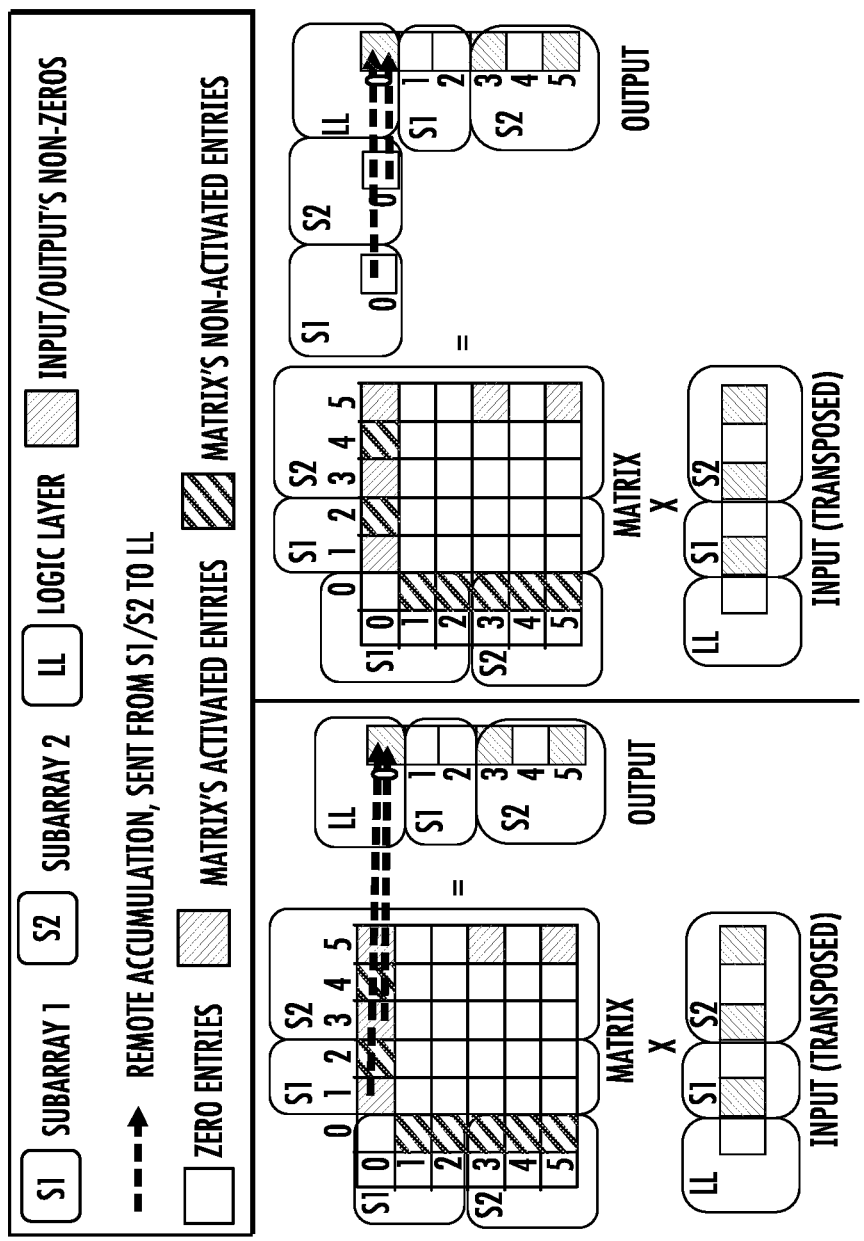

```
1    INPUT:
2        CSC_OFFSETS [0 :N]
3        //PAIR SPARSE FORMAT OF THE INPUT VECTOR
4        FRONTIER [0: NUMNONZEROS (INPUT) *2-1]
5    OUTPUT:
6        PACK [0 : PACKLENGTH-1]
7        PACKLENGTH
8    J=0;
9    //PACK FRONTIER VALUE WITH CORRESPONDING COLUMN INFORMATION
10   FOR (i=0; i< NUMNONZEROS (INPUT) *2; i=i+2) :
11       INDEX= FRONTIER [i]
12       PACK[J]= CSC_OFFSETS [INDEX]
13       PACK[J+1]= CSC_OFFSETS [INDEX+1]-CSC_OFFSETS [INDEX]
14       PACK[J+2]= FRONTIER [i+1]
15       j=j+3
16       PACKLENGTH= J+1
```

FIG. 10

```
1    INPUT:
2        PACK [0 : NUMNONZEROS (INPUT) *3-1]
3        CSC_PAIR [0: NUMNONZEROS (INPUT) *2-1]
4    OUTPUT:
5        OUTPUTDENSE [0 : N-1]
6    OUTPUTDENSE [:]=0
7    FOR (i=0; i< NUMNONZEROS (INPUT) *3; i=i+3) :
8        OFFSET= PACK [i]
9        LENGTH= PACK [i+1]
10       F_VALUE= PACK [i+2]
11       FOR (J=0; J< LENGTH; J=J+2) :
12           ROW_INDEX= CSC_PAIR [OFFSET+J]
13           ROW_VALUE= CSC_PAIR [OFFSET+J+1]
14           //THE FIRST STEP FOR GENERATING NXTFRONTIER
15           IF (OUTPUTDENSE [ROW_INDEX]==0)
16               SEND (0, ROW_INDEX) TO THE DISPATCHER
17           OUTPUTDENSE [ROW_INDEX] +=F_VALUE* ROW_VALUE
```

FIG. 11

MEMORY DEVICES INCLUDING PROCESSING-IN-MEMORY ARCHITECTURE CONFIGURED TO PROVIDE ACCUMULATION DISPATCHING AND HYBRID PARTITIONING

CLAIM FOR PRIORITY

The present application claims priority to U.S. Provisional Application Ser. No. 63/334,844, titled GEARBOX: A CASE FOR SUPPORTING ACCUMULATION DISPATCHING AND HYBRID PARTITIONING IN PIM-BASED ACCELERATORS, filed in the U.S.P.T.O. on Apr. 26, 2022, the entire disclosure of which is hereby incorporated herein by reference. The present Application is also related to commonly assigned U.S. Pat. No. 11,049,551 titled Memory Devices Providing In-Situ Computing Using Sequential Transfer Of Row Buffered Data And Related Methods And Circuits, the entire disclosure of which is incorporated herein by reference and which may be referred to herein as "Fulcrum."

STATEMENT OF GOVERNMENT SUPPORT

This invention was made with government support under Grant No. HR0011-18-3-0004 awarded by the Department of Defense/Defense Advanced Research Projects Agency (DARPA). The government has certain rights in the invention.

FIELD

The present inventive concept relates to the field of electronics in general and, more particularly, to electronic memory systems.

BACKGROUND

SIMID and row-wide bitwise approaches, such as Bank-level SIMID or subarray-level bit-parallel and bit-serial approaches can perform the same operation on multiple aligned words. These approaches cannot efficiently support SpMV and SpMSpV.

Logic-layer-based approaches can employ a few processing units with traditional or de-coupled access/execute architectures in a logic layer. These approaches move data along subarrays, banks, and layers, imposing data movement overhead.

NVM-based techniques employ NVM computation capabilities (e.g., CAM capability, analog MAC, and digital computation capabilities). Due to several issues with NVM-based approaches, including the hardware and energy overhead of analog-to-digital/digital-to-analog converters, low endurance, and high error rate, can occur.

Non-PIM approaches including several ASIC and FPGA designs target SpMSpV and graph processing. However, these approaches transfer data from memory to the accelerator, imposing data movement overhead.

SUMMARY

Embodiments of the present disclosure provide memory devices including processing-in-memory architecture configured to provide accumulation dispatching and hybrid partitioning. Pursuant to these embodiments, an integrated circuit memory device can include a plurality of banks of memory, each of the banks of memory including a first pair of sub-arrays comprising first and second sub-arrays, the first pair of sub-arrays configured to store data in memory cells of the first pair of sub-arrays, a first row buffer memory circuit located in the integrated circuit memory device adjacent to the first pair of sub-arrays and configured to store first row data received from the first pair of sub-arrays and configured to transfer the row data into and/or out of the first row buffer memory circuit, and a first sub-array level processor circuit in the integrated circuit memory device adjacent to the first pair of sub-arrays and operatively coupled to the first row data, wherein the first sub-array level processor circuit is configured to perform column oriented processing a sparse matrix kernel stored, at least in-part, in the first pair of sub-arrays, with input vector values stored, at least in part, in the first pair of sub-arrays to provide output vector values representing products of values stored in columns of the sparse matrix kernel with the input vector values.

BRIEF DESCRIPTION OF THE DRAWINGS

Throughout the drawings, reference numbers can be re-used to indicate correspondence between referenced elements. The drawings are provided to illustrate embodiments of the present disclosure and do not to limit the scope thereof.

FIG. 1(a) illustrates a row-oriented approach to operating on all rows of a kernel matrix using an input vector.

FIG. 1(b) illustrates a column-oriented approach to processing only the columns corresponding to the non-zero entries of the input vector which is transposed to illustrate the relation between non-zero entries of the input vector and the processed (activated) columns of the matrix.

FIG. 2(a) illustrates remote accumulations with column-oriented partitioning, where long columns cause load imbalance and many remote accumulations.

FIG. 2(b) illustrates remote accumulations with hybrid Partitioning where long column entries cause no remote accumulation and reduce load imbalance in some embodiments according to present invention.

FIGS. 3(a) and 3(b) illustrate memory organization including the (a) structure of layers and banks and the (b) structure of subarrays in some embodiments according to present invention.

FIG. 4 illustrates a sparse matrix in CSC and in CSC_Pair format in some embodiments according to present invention.

FIG. 6 illustrates pseudocode for column-oriented processing of sparse matrices in some embodiments according to present invention.

FIGS. 7(a) and 7(b) illustrate an optimization that replicates the output vector entries corresponding to long rows/columns in each subarray in some embodiments according to present invention.

FIG. 10 illustrates pseudocode for OffsetPacking in some embodiments according to present invention.

FIG. 11 illustrates pseudocode for LocalAccumulations in some embodiments according to present invention.

DETAILED DESCRIPTION

Figure 5B:
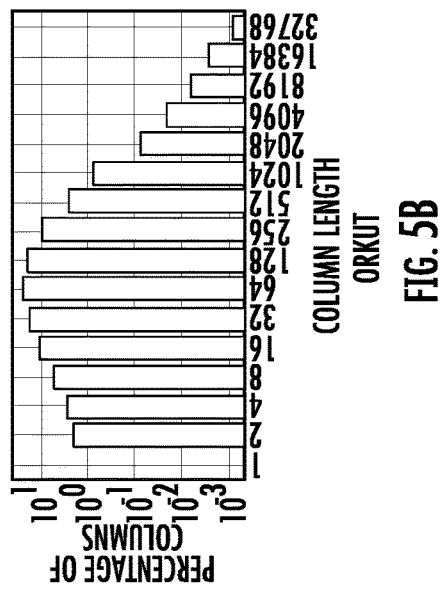
FIGS. 5(a)-5(e) illustrate column length distributions in real-world matrices where both x and y-axis are shown in log scale.
Figure 5A:
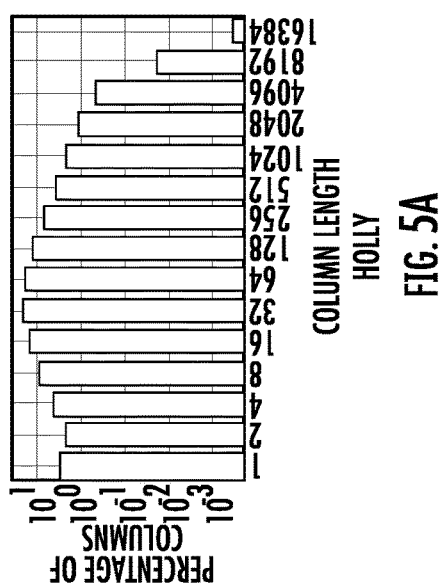
Figure 5E:
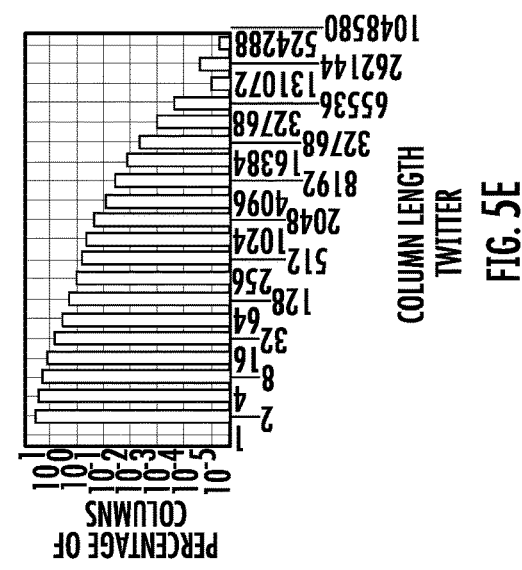
Figure 5D:
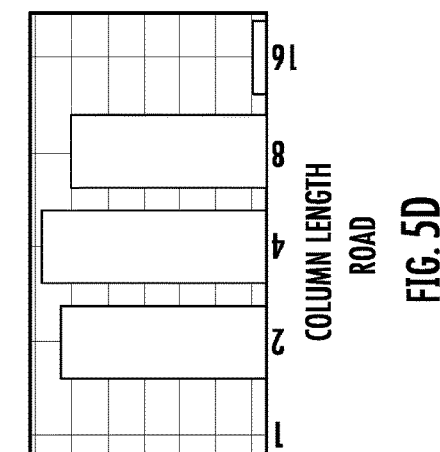
Figure 5C:
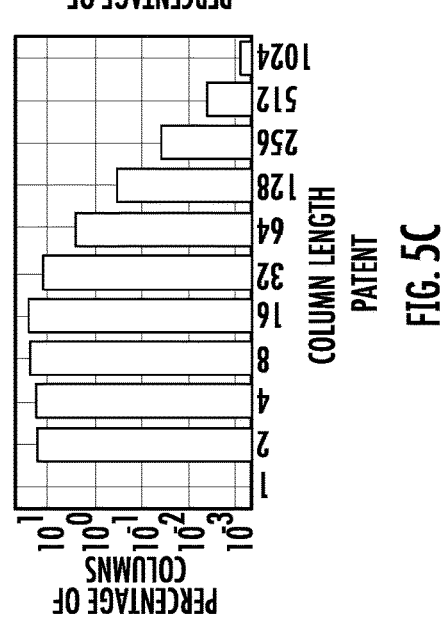

As described herein, in some embodiments according to the present invention, Processing-in-memory (PIM) may minimize data movement overhead by placing processing units near each memory segment (e.g., each bank or each subarray). As appreciated by the present inventors, however, kernels with random accesses may not effectively exploit the parallelism of these approaches. Without efficient support for random accesses, Arithmetic Logic Units (ALU) may remain idle until all the operands are collected from local memory segments (memory segment attached to the processing unit) or remote memory segments (other segments of the memory).

Generalized sparse-matrix-dense-vector (SpMV) and sparse-matrix-sparse-vector (SpMSpV), used in a wide range of applications, may perform random accesses. Accordingly, in some embodiments according to the present invention, for SpMV and SpMSpV, properly partitioning the matrix and the vector among the memory segments can affect memory performance. In particular, in some embodiments according to the present invention, partitioning may affect (i) how much processing load will be assigned to each processing unit and (ii) how much communication occurs among the processing units. In SpMSpV, unlike SpMV, the load assigned to each processing unit may depend on the non-zero entries of the input vector, making partitioning even more challenging.

Accordingly, in some embodiments according to the present invention, a highly parallel architecture can be used to exploit the available parallelism even in the presence of random accesses. As appreciated by the present inventors, in SpMV and SpM-SpV, most of the remote accesses become remote accumulations with the proper choice of algorithm and partitioning. In some embodiments according to the present invention, the remote accumulations may be offloaded to be performed by processing units adjacent to the destination memory segments, which may eliminate idle time due to remote accesses. Accordingly, a dispatching circuit can be used to provide remote accumulation thereby offloading some operations. Third, in some embodiments according to the present invention, a Hybrid partitioning and associated hardware support can be provided. In some embodiments according to the present invention, partitioning can enable (i) replacing remote read accesses with broadcasting (for only a small portion of data that will be read by all processing units), (ii) reducing the number of remote accumulations, and (iii) balancing the load.

As shown herein, in some embodiments according to the present invention, a Gearbox with just one memory stack, can provide an average (up to) 15.73× (52×) speedup over a server-class GPU, NVIDIA P100, with three stacks of HBM2 memory.

As used herein, the term sparse can refer to the fact that some "signal", usually represented by a vector x contains mostly zero or negligible values and only a few non-zero or significant values.

Section 1: Introduction

As appreciated by the present inventors, in current computing systems, the latency and energy consumption of fetching data from off-chip memory can be 2-3 orders of magnitude higher than an arithmetic operation. Processing-in-memory (PIM) architectures can alleviate this data movement overhead by placing processing units near memory segments (banks or subarrays).

SpMV and SpMSpV are computational kernels that are widely used but may be memory-intensive (requiring few computations per loaded datum from memory). The generalized forms of SpMV and SpMSpV, where the multiplication and addition can be replaced by other operations, appear in many important application domains such as machine learning (e.g., Support Vector Machine and Sparse K-Nearest Neighbor) and graph processing (e.g., Page Rank). Due to SpMV and SpMSpV kernels' memory-bound nature and widespread applications in various domains, they are natural candidates for PIM acceleration. As appreciated by the present inventors, adding support for these kernels to PIM-based accelerators can boost such applications' performance, expand the market for PIM, and increase vendors' motivation in PIM investment.

As appreciated, however, existing PIM architectures often are only optimized for regular kernels by providing high parallelism using SIMD units or bit-level parallelism. In the present disclosure, embodiments according to the present invention are described to provide a PIM architecture that provides high parallelism for SpMV and SpMSpV. As further described herein the disclosed architecture can outperform SIMD approaches for regular kernels as well.

There are two major approaches for SpMV and SpMSpV: (i) row-oriented or matrix-driven approach (FIG. 1(a)), and (ii) column-oriented or vector-driven approach (FIG. 1(b)). The row-oriented approach processes every non-zero element of the input matrix for both SpMV and SpMSpV. On the other hand, for SpMSpV, the column-oriented approach may only process the columns corresponding to the non-zero entries of the input vector. These columns and their non-zero entries are described as being activated columns and activated entries, respectively. As a result, embodiments using the column-oriented approach may be more efficient for SpMSpV.

As appreciated by the present inventors, no prior bank-level or subarray-level PIM-based SpMV accelerators have implemented column-oriented processing. Embodiments according to the present invention can maximize the benefits of column-oriented processing by addressing two issues: i) random accesses to remote memory segments and ii) power-law column length distribution.

Random Accesses to Remote Memory Segments:

As appreciated by the present inventors, processing SpMV and SpMSpV in PIM calls for the compressed matrix, the input vector, and the output vector to be partitioned among memory segments. With both row-oriented and column-oriented approaches, the processing units adjacent to each segment uses access to data that is stored in another memory segment. For example, in FIG. 2(a), one of the multiplication and addition required for generating Output [3] is Output[3]+=Matrix[3, 0]*Input[0]. However, FIG. 2(a) shows that Input[0] and Matrix[3, 0] reside in Subarray 1 (S1), but Output[3] resides in Subarray 2 (S2). Therefore, the processing unit in S1 does the multiplication part (Input [0]*Matrix[3, 0]) locally but has to access Subarray 2 (S2) to write the result of multiplication in Output[3].

The remote write accesses are remote accumulations that do not require any mechanism for enforcing the order of operations. Therefore, the result of multiplications can be sent to be accumulated in the destination memory segment. For example, S1 can send the multiplication result to S2 to be added to Output[3] in S2 and continue processing another multiplication and do not need to wait until the accessed operand arrives from a remote memory segment.

In some embodiments according to the present invention, accumulation dispatching circuit (e.g., dispatcher) can be used. In such embodiments, a dedicated subarray in each bank can act as a dispatcher for remote accumulations. Without the dispatcher, each remote accumulation could interrupt the normal processing of the processing unit in the remote subarray. Accordingly, the dispatcher collects all the remote accumulations and sends them to their destination once the destination subarray's processing ends. This solution may sacrifice only about 6% of capacity. In Section 7.3 herein, we show an alternative impractical approach for comparison.

Power-Law Column Length Distribution:

Real-world sparse matrices' column lengths follow the power-law distribution. That means most of the rows/-columns contain very few non-zero entries (referred to as short rows/columns), while the remaining row/columns have orders of magnitude higher numbers of non-zero entries (referred to as long rows/columns). The natural way of partitioning a matrix for the column-oriented approach is to assign a few full columns to each memory segment, where the input entries that activate these columns reside. However, with a power-law column length distribution, whenever a long column gets activated, the processing unit of the subarray that has this column has to perform many more multiplications than other processing units, causing load imbalance. We also observed that, with naive column-oriented partitioning, most of the remote accumulations are due to long columns.

To address these issues, in some embodiments according to the invention, a Hybrid partitioning scheme can be used that treats short and long columns differently. In such embodiments, the short columns are partitioned in a normal column-oriented way, whereas the long columns' non-zero entries are distributed among all memory segments, so that each non-zero entry and its corresponding entry in the output vector reside in the same memory segment. In some embodiments according to the present invention, hardware support is also used for the disclosed partitioning. To lower the overhead of our hardware support, the matrix can be reordered so that the long columns/rows are the first columns/rows of the matrix so that their index is less than a threshold. As a result, embodiments according to the present invention can be used to distinguish the indexes corresponding to these long columns and long rows using a comparator and a latch that holds the threshold.

FIG. 2(b) shows that with Hybrid partitioning, the long column no longer causes any remote accumulation, since Matrix[3:5, 0] and Output[3:5] reside in the same subarray. This partitioning also alleviates load imbalance, because all processing units co-operate on processing an activated long column.

With Hybrid partitioning, for multiplications, all subarrays need to access the input vector entries that activate long columns. These entries can be stored in the logic layer (one of the layers in 3D stack memories, described in Section 2) and broadcast to all subarrays. For example, in FIG. 2(b), Input[0] is placed in the logic layer.

Based on these the aspects described above, PIM memory devices and systems utilizing column oriented processing of sparse-matrix kernels with input vectors are disclosed herein (sometimes referred to herein as "Gearbox") can add efficient hardware supports for column-oriented processing to PIM-based accelerators. Embodiments according to the invention can use Fulcrum as the baseline PIM architecture for Gearbox. Fulcrum places one lightweight single-word processing unit at every two subarrays to achieve high parallelism. The subarray-level single-word processing allows parallel and independent access per single-word ALU. Therefore, unlike SIMD approaches, the ALUs do not have to wait for all the operands to be collected. However, Fulcrum only supports sequential accesses, whereas local random accesses (i.e., random access within the same subarray) and remote accesses may be used by the SpMV and SpMSpV kernels. Accordingly, Fulcrum can be modified to add support for a new range of applications by enabling local random accesses, as well as adding support for the disclosed accumulation dispatching and Hybrid partitioning. In some embodiments according to the present invention, support for local random accesses, accumulation dispatching, and Hybrid partitioning is programmable, enabling future works to map more irregular kernels to the disclosed architecture.

As disclosed herein, a Gearbox implementation with just one memory stack, can deliver on average (up to) 15.73× (52×) speedup over a server-class GPU, NVIDIA P100, with three stacks of HBM2 memory. Compared to GPUs with more memory stacks, a Gearbox implementation is highly competitive in terms of speedup per stack because the Gearbox implementation delivers on average 45× speedup per stack compared to NVIDIA P100. As demonstrated herein, a Gearbox implementation can also outperform a PIM-based SpMV accelerator that only supports row-oriented processing (assuming no area overhead, perfect load balancing, and no penalty for remote reads for SpaceA) by 58× (447×) per area.

Accordingly, in some embodiments according to the present invention, a highly parallel architecture can be provided to exploit the parallelism for regular kernels, as well as SpMV and SpMSpV. Further, in some embodiments according to the present invention, an in-memory-layer approach (near banks/subarrays) can be used to implement column-oriented processing, which can be more efficient than row-oriented processing. Furthermore, in some embodiments according to the present invention, the disclosed hybrid partitioning can reduce remote accumulations and alleviate load balancing. Still further, in some embodiments according to the present invention, hardware support can be provided for remote accumulations and Hybrid partitioning.

Section 2: Memory Architecture 2.1 Memory Hierarchy

Embodiments according to the present invention can be utilized in memory devices and systems having the architecture shown in FIG. 3(a), which illustrates a 3D stacked memory, where a stack comprises a few memory layers and may include a logic layer. Each memory layer has several banks. Every two or four banks in a layer form a group, and a through-silicon via (TSV) connects the groups in different layers to form a vault. A bank comprises several subarrays that are connected through a shared global data line (GDL) (FIG. 3(b)). To access one column of the data from a bank, a subarray reads an entire row and stores the row in a row-wide buffer, known as the row buffer. Then a column decoder at the edge of each bank selects a column from the row. The selected column traverses the GDL to reach the edge of the bank. We choose memory configurations with short rows (e.g., 2048 bits), because memory configurations with short rows are more efficient for parallel row activations and random accesses, where only a few words of a row are useful.

2.2 Sparse Operations

As used herein a generalized matrix-vector multiplication is denoted as Output[:]=Matrix[:,:]×Input[:], where Input[:] and Output[:] are vectors, and Matrix[:,:] is a matrix. The term "generalized", means that multiplications and accumulations can be replaced by any other operation with similar properties (e.g., commutativity). In most applications, an extra step may be needed on the output vector final Output[:]=Output[:]+αy[:], where α is a scalar value and y[:] is a vector. The addition and multiplication in this step can also be replaced by any other operation, which is referred to herein as "applying."

Many applications can be formulated as SpMV and SpMSpV. For example, Single-Source Shortest Paths (SSSP), a graph processing application, can be formulated as SpMSpV, in which multiplication is replaced by addition, and the accumulation operation is replaced by minimization.

2.3 Sparse Matrix Representations

There are two main data representations for sparse matrices: (i) compressed sparse rows (CSR) and (ii) compressed sparse columns (CSC). CSC/CSR stores the matrix in three arrays containing: (i) non-zero values (Values), (ii) row/column indices of non-zero values (Indexes), and (iii) offsets (Offsets) that refer to the positions of the start of the columns/rows in both Values and Indexes arrays.

CSC representation is more efficient for column-oriented processing, as it has the position of the start of each column. The Values and Indexes arrays can be paired to provide one array (CSC_Pair), as shown in FIG. 4.

Section 3: Column-Oriented Processing and Hybrid Partitioning

Section 3.1 Support for Column-Oriented Processing Using Accumulation Dispatching FIG. 6 shows that the column-oriented algorithm only processes the columns that correspond to non-zero entries of the input vector. Therefore, column-oriented processing operates on the sparse format of the input vector (lines 4 ¬5). This format of the input vector is referred to as the frontier (line 5, currFrontier in FIG. 6). Column-oriented processing also uses random access to the output vector (lines 20¬21). When the matrix and the input/output vectors are partitioned among memory segments, the accumulation in line 21 can be remote or local. For example, in FIG. 6, consider a subarray containing Matrix[:, j:k], Input[j:k], and Output[j:k]. In line 21, if j≤row index≤k, the accumulation is a local accumulation. Otherwise, it is a remote accumulation.

Accordingly, we add hardware support for distinguishing remote accumulations from local accumulations by placing a comparator and two latches that hold the range of index of local accumulations. We also propose a mechanism for dispatching remote accumulations, Accumulation dispatching. In this mechanism, one specialized subarray in every bank acts as a dispatcher for the remote accumulations, which is further described in Section 4.

3.2 Reducing Remote Accumulations and Balancing the Load by Supporting Hybrid Partitioning FIG. 5 shows the column length distribution of the evaluated datasets, where the x-axis (log scale) shows the column length and the y-axis is the percentage of columns within that range. This figure demonstrates that there are only a few long columns, but they are orders of magnitude longer than the other columns. The same is true for the long rows. The top X % (e.g., 0.01%) of columns/rows are referred to as long columns/rows. In some embodiments according to the invention, this threshold is configurable.

FIG. 2(a) in Section 1 demonstrates that, with column-oriented partitioning, where each subarray has a few full columns, the long columns can cause many remote accumulations and significant load imbalance among processing units.

Given these observations, Hybrid partitioning can be used to both balance the load and reduce the number of remote accumulations. FIG. 2(b), in Section 1, illustrates that Hybrid partitioning treats short and long columns differently. The short columns are partitioned in a column-oriented way but the long columns are distributed among all subarrays. Consequently, each part of a long column resides in the same subarray in which its corresponding part of the output vector resides, eliminating remote accumulations. Furthermore, all subarrays cooperate for processing long columns, alleviating the load imbalance.

In iterative algorithms, the output vector becomes the input vector of the next iteration. Therefore, in the next iteration, all subarrays for multiplication require accessing the output vector entries that activate a long column. The output vector entries are placed corresponding to long columns in the logic layer. In the subsequent iterations, they are broadcast to all subarrays from the logic layer, eliminating the need of copying from the output vector to the input vector. Since there are only a few activated long columns in each iteration, the broadcasting imposes negligible overhead. The overhead is evaluated in Section 7.4.

Real-word matrices may also contain a few long rows. FIG. 7(a) shows that these long rows can trigger many remote accumulations. To reduce this remote accumulation overhead, the output entries are placed corresponding to the long rows in the logic layer. The logic layer provides more efficient random accesses since it has SRAMs.

To implement Hybrid partitioning, the subarray-level processing units are configured to distinguish among input/output entries corresponding to the long columns. The matrix is reordered so that the long columns/rows of the matrix and their index are lower than a threshold. As a result, this distinction can be implemented with a comparator and a latch that keeps the index of the last long column/row. Section 6 illustrates that this one-time cost may be acceptable.

To further minimize the overhead of accumulation of long columns/rows, an optional optimization may be added, where the output vectors are replicated corresponding to the long columns/rows in all subarrays. Then the long rows are accumulated, first locally in each subarray and then in the logic layer (FIG. 7(b)). If 0.01% of rows/column are chosen as long rows/columns, the capacity overhead of this technique stays below 1.7%.

Section 4: Gearbox Architecture

In some embodiments according to the present invention, Fulcrum can be used as the baseline PIM-based architecture. Motivated by characteristics of memory-intensive applications, where there are few simple operations per loaded datum from memory, Fulcrum places one simplified sequential processing unit per pair of subarrays. In some embodiments according to the present invention, each subarray-level processing unit (SPU) includes a few registers, an 8-entry instruction buffer, a controller, and an ALU circuit. In Fulcrum, every pair of subarray has three row-wide buffers, referred to as "Walkers." The Walkers load an entire row from the subarray at once, but the processing units sequentially access and process one word at a time. The sequential access is enabled by using a one-hot-encoded value, where the set bit in this value selects the accessed word. Therefore, to sequentially process the row, the processing unit only needs to shift the one-hot encoded value.

Fulcrum provides a more flexible and efficient approach than bank-level SIMD approaches for three reasons. First, the three Walkers enable three concurrent sequential accesses. Second, Fulcrum can exploit the parallelism for operations with data dependency because Fulcrum processes row-wide buffers sequentially. Third, Fulcrum can efficiently exploit the parallelism for operations with branches because each subarray has an 8-entry instruction buffer that allows each ALU circuit to perform a different operation independently.

However, given that Fulcrum only provides sequential accesses and is inefficient for irregular kernels that require random accesses, communications among subarrays, or load balancing, in some embodiments according to the invention, Gearbox can be configured to (i) modify the sequential access mechanism of Fulcrum to enable local random accesses, (ii) add in-memory-layer interconnection and a dispatching circuit to enable remote accumulations, (iii) add ISA and hardware support for our proposed Hybrid partitioning, which minimizes communications among subarrays and provide hardware support for load balancing. These modifications add only about 10.93% area overhead to Fulcrum but enable exploiting the high parallelism of Fulcrum for a new range of important applications.

Figures 8A, 8B, 8C:
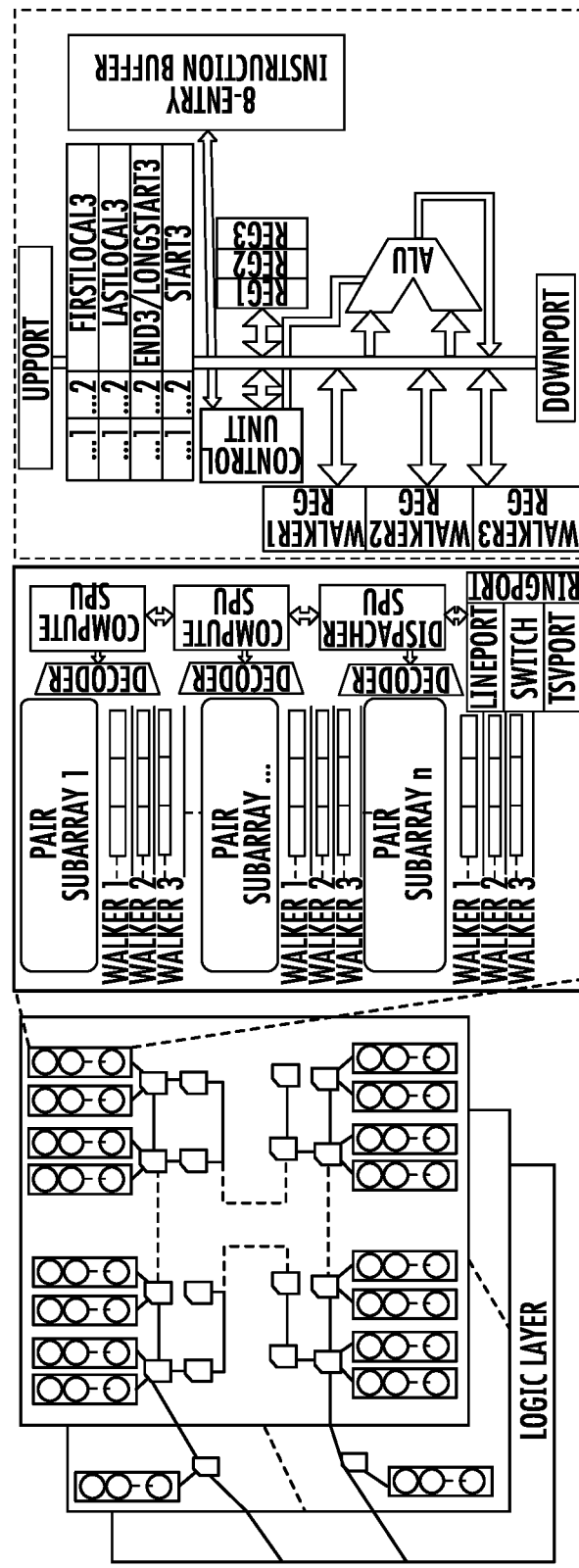
FIGS. 8(a)-8(c) is a hierarchical block diagram of a PIM memory device architecture illustrating (a) layers of the memory device showing banks as rectangles, sub-arrays as circles, and pentagons as switches, and (b) a bank of the memory device including pairs of the sub-arrays/Walkers and (c) a subarray-level processing unit or circuit in some embodiments according to present invention.

FIG. 8 illustrates our proposed architecture, which is based on 3D-stacked memories. In some embodiments, every vault has a simple in-order core with a 32 KB SRAM scratchpad underneath it, in the logic layer. A ring interconnection topology (FIG. 8(a)) connects the banks in each memory layer. Subarrays within a bank are connected through a line interconnection topology (FIG. 8(b)). As shown in FIG. 8(b), there are two types of SPUs. The subarrays closest to the ring interconnect contain Dispatcher SPUs. Other subarrays contain Compute SPUs.

The logic layer components launch a kernel (or one step of a kernel) by broadcasting at most 8 instructions to all Compute and Dispatcher SPUs and loading new values from each subarray to the associated latches.

In this section, we elaborate on the role of each part of our architecture, using a simple kernel, C[A[:]]+=B[:]. At a high level, a Compute SPU reads the $i^{th}$ entry of array A[:], compares this entry against three latches, and processes the accumulation differently based on the result of this comparison. These three latches are FirstLocal3, LastLocal3, and LastLong3. If FirstLocal3<A[i]<LastLocal3, the accumulation is a local accumulation. If 0<A[i]<LastLong3, the accumulation is again a local accumulation but on the replicated part, C[0:LastLong3]. Otherwise, the accumulation is a remote accumulation. In this case, the Compute SPU sends the index-value pair (A[i] and B[i]) to the Dispatcher.

We use this simple example to introduce our modifications to Walkers, provide a walk-through example, and explain the role of Dispatchers. In the end, we elaborate on the details of the instruction format.

This section elaborates on the role of each part of the architecture using a simple kernel, C[A[:]]+=B[:]. At a high level, the Compute SPU reads the $i^{th}$ entry of array A[:], compares it against three latches, and processes the accumulation differently based on the result of this comparison. The three latches are FirstLocal3, LastLocal3, and LastLong3. If the entry is between FirstLocal3 and LastLocal3, the accumulation is a local accumulation. If the entry is between 0 and LastLong3, it is a local accumulation on the replicated part, C[0:LastLong3]. If the entry is outside these ranges, the accumulation is a remote accumulation, and the Compute SPU sends the index-value pair (A[i] and B[i]) to the Dispatcher. This example is used to illustrate the modifications to row the buffer memory circuit (i.e., Walkers), provide a walk-through example, and explain the role of Dispatchers.

4.1 Walkers and Indirect Accesses

PIM architecture targets memory-intensive applications that process large arrays. Each row buffer memory circuit reads from or writes to one of these large arrays. The Start1/2/3 latches determine the row address, and the End1/2/3 latches determine the end address of the arrays associated with each row buffer memory circuit, respectively (as shown in FIG. 8(c)).

For instance, one row buffer memory circuit loads one row from A[:]. The controller then accesses the row one word at a time by shifting the one-hot-encoded value of the row buffer memory circuit. When the set bit in the one-hot-encoded value reaches the last position, the controller loads a new row from array A[:].

In the previous example, however, the array C[:] was being randomly accessed using A[:]'s entries. Such access is referred to as an indirect access. To facilitate indirect accesses, two fields are added to the instruction format, which determine the register containing the index of the indirect access and the row buffer memory circuit used to load the row containing the accessed word. The controller derives the row address and column address using the index. To select the accessed word from the row, the one-hot-encoded value is shifted, and a counter is incremented until the counter equals the column address. To optimize the access time, loading a new row into the row buffer memory circuit and shifting the one-hot-encoded value are overlapped using the sub-clock introduced in [33]. This simple modification allows for parallel and independent random access per ALU in the accelerator, enabling applications with high access divergence.

4.2 a Walk-Through Example

Figure 9:
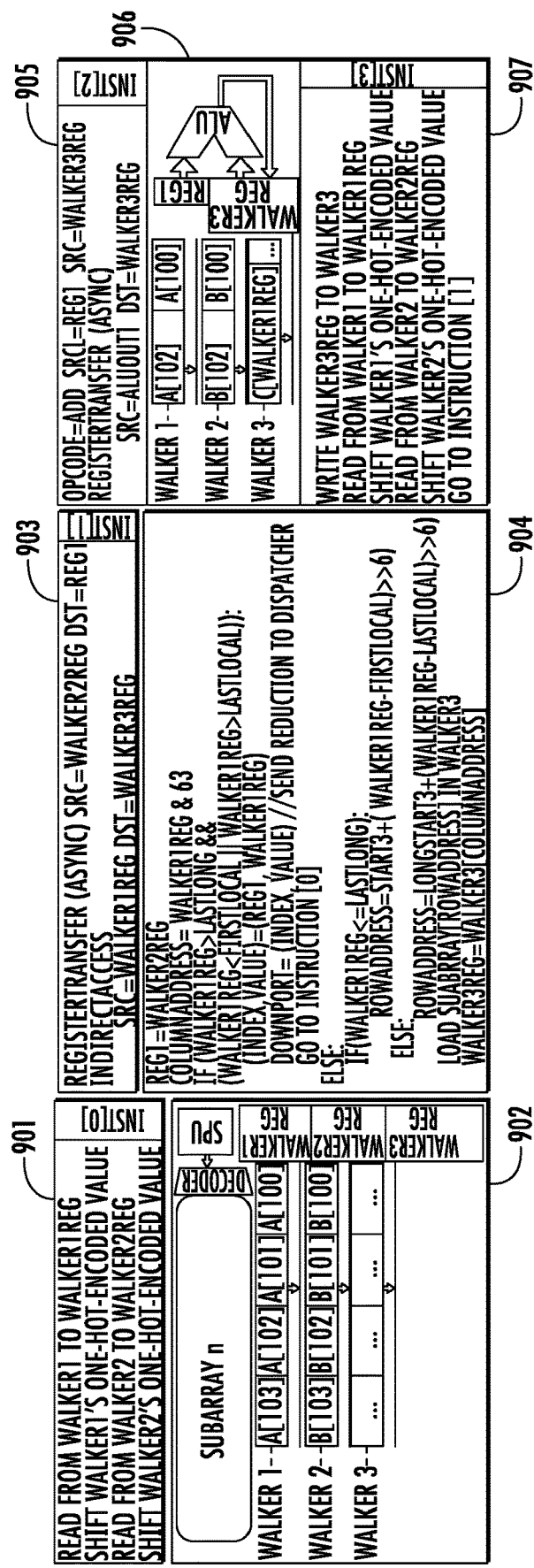
FIG. 9 is a flow diagram the illustrates an example of a sequence of operations for processing a kernel C [A [i]]+=B [i] with four instructions in some embodiments according to present invention.

In FIG. 9, the pseudo format 901 of instruction[0] is shown, while the operation 902 performed by instruction[0] is illustrated. Using this instruction, the Compute SPUs load one word from Walker1 into Walker1Reg and one word from Walker2 into Walker2Reg.

Instruction[1], according to 903 and 904 in FIG. 9, involves the SPU moving Walker2Reg to reg1 and comparing the Walker1Reg against the three latches (FirstLocal3, LastLocal3, and LastLong3). If FirstLocal3<Walker1Reg<LastLocal3, the Compute SPU derives the row address and column address of C[Walker2Reg], using the Start3 latch. If 0<Walker1Reg<LastLong3, the row address is derived using the LongStart3 latch that stores the start of the replicated part of C[:] (i.e., C[0:LastLong3]). Using the indirect mechanism explained in the previous subsection, SPU loads C[Walker1Reg] into Walker3Reg. If the accumulation is a remote accumulation, the controller places the index and the value stored in Reg1 and Walker1Reg on the line interconnection's port (DownPort in FIG. 8(c)) and returns to instruction[0].

Otherwise, as shown in 905 and 906 of FIG. 9, Instruction [2] performs the accumulation (Walker3Reg+=Reg1). Instruction[3] 907 writes the Walker3Reg register to the Walker3, loads one word from Walker1 into Walker1Reg, loads one word from Walker2 into Walker2Reg, and returns to Instruction[1]. The controller iterates over these instructions until all A[i] entries are processed.

4.3 Dispatcher and the Bank-Level Switch

The Dispatcher SPUs, responsible for routing remote accumulation packets, are located in the subarrays closest to the ring interconnect (FIG. 8(c)). They contain a switch that keeps the range of the indexes assigned to its bank and its layer in corresponding latches to assist in packet forwarding.

In the example provided, the Compute SPUs send any non-local index-value pairs to the Dispatcher in the bank. When the Dispatcher receives an index-value pair, if the index belongs to its bank, the Dispatcher loads the index-value pair in one of its walkers. If the index-value pair belongs to the same memory layer, the Dispatcher places it on the ring interconnection's port. Otherwise, the Dispatcher forwards the index-value pair to a different memory layer via TSVs. As a result, multiplications and local accumulations are overlapped with sending remote accumulations.

After the multiplication and local accumulation, to complete the remote accumulations, two additional steps are required. In the first step, the Dispatchers start sending the index-value pairs to Compute SPUs in the same bank. In the second step, each Compute SPU processes the received index-value pairs to perform the final accumulation (using instructions that are analogous to the instructions in the first step).

4.4: Maintaining the Sparse Format of the Output Vector

To maintain the sparse format of the output vector, fields can be added to the instruction format. Instead of processing C[:] sequentially and generating a list of indexes of non-zero values, the controller detects the accumulations that are changing a zero value and acts based on what is programmed by the instruction. A latch is added to keep the clean-value indicator, which can be different for different applications. Section 5 explains how this feature is used for generating a sparse format of the output vector for SpMSpV.

4.5: Instruction Format

Table 1 demonstrates the instruction format of the proposed architecture and lists the bitwidth and description of each field. The instruction format allows for two operations per instruction and concurrent read and write from/to Walkers. The IndirectAccSrc and indirectAccDst field enables programmable support for indirect access. The LongEntryTreat field adds support for Hybrid partitioning. CheckCleanVal, CleanValIndxSrc, and CleanPairDst field enable the generation of a sparse format of the output vectors.

TABLE 1

Instruction format of Gearbox

| Instruction | Width | Description |
|---|---|---|
| NextPC1 | 3 bits | Program counter of the instructions. |
| NextPC2 | 3 bits | |
| NextPC_Cond | 4 bits | Condition that selects between NexpPC1 or NextPC2 as the next instruction. |
| DecLoop | 1 bits | decrement loop counter |
| OpCode1 | 4 bits | Opcode of the instructions. |
| OpCode2 | 4 bits | |
| Src1Op1 | 3 bits | Sources of operation indicated by OpCode1 |
| Src2Op1 | 3 bits | |
| Src1Op2 | 3 bits | Sources of the operation indicated by OpCode2 |
| Src2Op2 | 3 bits | |
| ShiftCond1 | 3 bits | Condition under which the Walker's one-hot-encoded value is shifted. |
| ShiftCond2 | 3 bits | |
| ShiftCond3 | 3 bits | |
| ReadWrite1 | 1 bit | Read from or write to corresponding Walker. |
| ReadWrite2 | 1 bit | |
| ReadWrite3 | 1 bit | |
| RegSrc | 3 bits | Selects the source and the destination of a register transfer. |
| RegDst | 4 bits | |
| IndirectAccSrc | 2 bits | Register from which the index is read. |
| IndirectAccDst | 2 bits | Walker that loads the row for the indirect access. |
| LongEntryTreat | 1 bit | Determines how to treat long-activating indexes (reduce locally or send downwards) |
| CheckCleanVal | 1 bit | Determines if ALU should check for a clean value |
| CleanIndexSrc | 2 bits | Determines the register containing the index of a clean value. |
| CleanPairDst | 2 bits | Determines whether the clean index should be loaded into a Walker or sent to the Dispatcher. |

Section 5: SPMSPV Walk-Through

The SpMSpV can be mapped to the architecture using the following steps. Step 1 (FrontierDistribution): In Section 2, it is explained that the sparse format of the input vector is called the frontier. In the first iteration, the frontier is partitioned and distributed among subarrays. In most algorithms, the first frontier is very small (e.g., one entry for BF S). In iterative applications, the frontier is generated in previous iterations and already resides in subarrays in which their corresponding columns reside, except for the output entries that correspond to long row/columns, which reside in the logic layer. At the start of each iteration, the entries residing in the logic layer are broadcasted to all subarrays and appended to the frontier array in each subarray.

Step 2 (OffsetPacking): This step packs the column offset, column length, and the values from the frontier array that should be multiplied in the column into a new array. FIG. 10 shows the pseudo-code of this step.

Step 3 (LocalAccumulations): This step multiplies each value of the frontier with its corresponding column. FIG. 11 demonstrates the pseudo-code of this step. In this step, if a clean value is being updated, the clean value indicator and its row index are sent to the Dispatcher.

Step 4 (Dispatching): In this step, the Dispatcher sends all the stored entries (index-value pairs) to their destination subarrays. Here, the Dispatcher's Walker acts as a buffer.

Step 5 (RemoteAccumulations): In this step, the SPU sequentially processes index-value pairs received in the previous step and performs the accumulations. Also, in this step, if the value in the index-value pair is a clean-value indicator, the index of clean-value is appended to the corresponding array.

Step 6 (Applying): This step processes the array containing the non-zero indexes to generate the frontier for the next iteration, initializes the output vector to clean indicators, and sends long-activating entries to the logic layer to be reduced and applied there. It also performs the apply operation (finalOutput[:]=Output[:]+αy[:], which is described in Section 2).

Section 6: Software Stack

PIM-based accelerators are efficient for applications that can offload a large dataset to the accelerator once and process any incoming input using the data stored in the accelerator. For example, database tables, as well as matrices for deep learning, graph, and classic machine learning applications, can be offloaded to the accelerator once and used for processing many inputs. In all these domains, the one-time cost of pre-processing and data placement has typically been considered acceptable.

Pre-processing: Gearbox partitions long columns and replicates the column offset for each partition. To balance the load, Gearbox randomizes the order of columns assigned to a bank and then reorders the matrix so that the long columns and long rows are the first columns and rows of the matrix.

Data placement: For placing data, Gearbox uses the offload paradigm. Therefore, an API similar to CUDA's API (cudaMemcpy( )) manages the data transfer. Gearbox allocates contiguous memory space for each array in each subarray independently and then stores the row address of each array as metadata. Then, in each step, Gearbox loads these metadata in the Start and End latches (as shown in FIGS. 8(c) and (d)).

Programming model: Gearbox was based on a library-based programming model, where a compiler links the kernels in computation graphs of a high-level framework (such as TensorFlow).

Scaling the proposed method for larger datasets: Gearbox was evaluated using large datasets. Gearbox provides high parallelism in one stack. Therefore, Gearbox does not need multiple stacks for these dataset sizes. However, to extend the architecture for larger datasets, Gearbox can use multiple stacks (4-16) per device. To extend the capacity even more, Gearbox can connect multiple devices by NVLink3 and NVswitch or similar inter-device interconnection, which allows all-to-all device communications. To extend to multiple devices and multiple stacks, Gearbox can partition the matrix into several blocks, where each block is assigned to one stack. In this case, Gearbox can use an additional step that reduces the results of all blocks. NVLink supports collective operations (e.g., broadcast and allReduce operations) that efficiently support the required inter-device communications for our proposed method.

Supporting kernels with more than three arrays or more than eight instructions: SpMSpV is an example of a kernel that requires more than three arrays. Since Gearbox is described herein using three Walkers, the first step of this approach can be separated into two steps, where each step has three arrays. Given that in-memory-layer PIM-based accelerators with high parallelism target memory-intensive application, with few instructions per loaded data, a few-entry instructions buffer is enough. The instruction buffer can be extended at the cost of higher area overhead. A software solution for mapping a kernel with more than 8 instructions is to break the algorithm into few steps, similar to what we do for SpMSpV. It will be understood that embodiments according to the present invention can include fewer than three Walkers or more than three Walkers.

Handling corner cases: If the amount of remote accumulations is high, the Dispatcher SPU in the LocalAccumulations step or a Compute SPU in the Dispatching step may not find enough space for storing the received index-value pairs. To address this issue, a software-hardware-based mechanism can be added. Section 4 describes that each Walker has an End latch that indicates the end of its corresponding array. When a Walker reaches the row address that is one less than the row address of the End latch, the SPU raises a signal that lets the logic layer know that the reserved space is about to be full. Then the logic layer controller stalls the senders (depending on the step, could be the Compute SPUs or the Dispatchers) and initiates the next step, making the array empty again.

Section 7: Evaluation 7.1 Methodology

Gearbox was evaluated using three graph algorithms and two sparse machine learning kernels: Breadth-First Search (BFS), Page Rank (PR), Single-Source Shortest Path (SSSP), Sparse K-Nearest neighbors (SPKNN), and Support Vector Machine (SVM). Datasets were varied to capture different characteristics of applications for different inputs. Table 3 shows the datasets, which are real-world matrices from the SuiteSparse matrix collection, and Table 2 lists the configurations of the evaluated systems.

TABLE 2

Configuration details for evaluated architectures

| Component | Parameters |
|---|---|
| GPU | Tesla P100 [1]. 12 GB memory |
| | 3 HBM2 memory stacks at 549 GB/s |
| | (183 GB/s per stack) |
| Ideal in-logic-layer GPU | 512 GB/s per stack [7] |
| Gearbox | technology: 22 nm, 32 vaults |
| | 32 subarray, open-bitline structure, |
| | 256 bytes per row, 64 banks per layer |
| | 8 memory layers, row cycle: 50 ns, frequency: |
| | 164 MHz |
| | in-logic-layer components per vault: |
| | 4-32 kB SRAM, an ARM Cortex-A35 [15] |
| | interconnection: 1.2 GHZ, 64 lane, latency: 0.8 |
| | ns for each interconnection segment [20, 52] |

TABLE 3

Evaluated datasets

| Matrix | Full name | Rows | Non-Zeros | Density | Size (Bytes) |
|---|---|---|---|---|---|
| Holly | hollywood_2009 | 1139905 | 112751422 | 0.0086% | 911,130,616 |
| Orkut | soc_orkut | 2997166 | 212698418 | 0.0023% | 1,725,564,672 |

TABLE 3-continued

Evaluated datasets

| Matrix | Full name | Rows | Non-Zeros | Density | Size (Bytes) |
|---|---|---|---|---|---|
| Patent | cit_Patents | 3774768 | 33037896 | 0.00023% | 294,501,312 |
| Road | road_usa | 23947347 | 57708624 | 0.00001% | 653,247,768 |
| Twitter | soc_twitter-2010 | 21297772 | 530051618 | 0.0001% | 4,410,795,120 |

An event-accurate simulator for Gearbox was developed and integrated with Gunrock to validate the algorithms. Further evaluation of the simulator was provided by assertion testing and analytical evaluations. An RTL model of our SPUs in 14 nm technology was developed and incorporated an overall penalty of 3.08× for processing in 22 nm DRAM. The penalty incorporates the effect of larger technology node and other inefficiencies. Gearbox was evaluated with a frequency of 164 MHZ. The frequency of interconnection and one-hot-encoder shifter is 1.2 GHZ.

The latency, energy consumption, and area of memory elements and interconnect elements was evaluated using CACTI-3DD. For the breakdown of energy consumption of GPUs, we used Moveprof, which is a tool based on integrating NVIDIA's NVProf and GPUWattch.

7.2 Speedup

Figure 12:
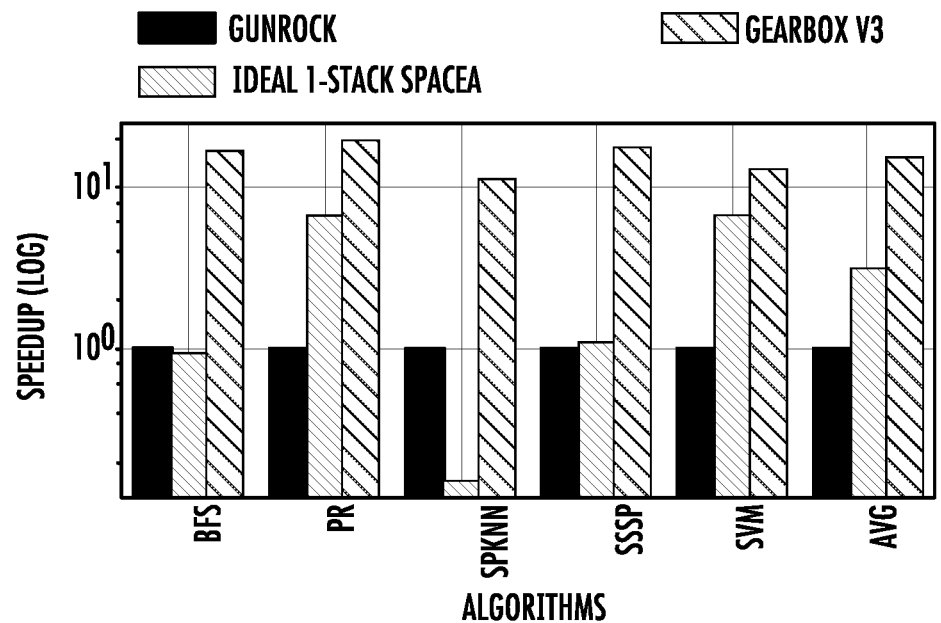
FIG. 12 is a graph that illustrates speedup of GearboxV3 against a GPU framework (Gunrock) and a comparative system (SpaceA), averaged over datasets where the values that are less than $10^0$ represent slowdown in some embodiments according to present invention.

FIG. 12 compares GearboxV3 against a server-class GPU and other systems, SpaceA. Gearbox, with just one memory stack, delivered on average (up to) 15.73× (52×) speedup over a server-class GPU, NVIDIA P100, with three stacks of HBM2 memory. Gearbox also outperformed an ideal model of SpaceA, a PIM-based SpMV accelerator that only supports row-oriented processing. However, SpaceA reported only 4.86% area overhead. Assuming no area overhead, perfect load balancing, and no penalty for remote reads for SpaceA, Gearbox outperformed SpaceA, on average (up to), by 58× (447×) per area. The speedup over SpaceA stems from the fact that Gearbox provides higher parallelism and efficient support for column-oriented processing.

The aspects described herein can enable column-oriented processing for all PIM approaches, including SpaceA and others. These aspects can enable column-oriented processing for all PIM approaches and can improve them. For example, these aspects can speed up SpaceA by 3.4 times.

The speedup of Gearbox against GPU stems from three sources: (i) higher internal bandwidth compared to GPU, (ii) lower overhead for random accesses where only a few words out of a cache line is useful, and (iii) inefficiency of SIMD units in GPU for irregular applications.

7.3 the Effect of Each Optimization

Figure 13:
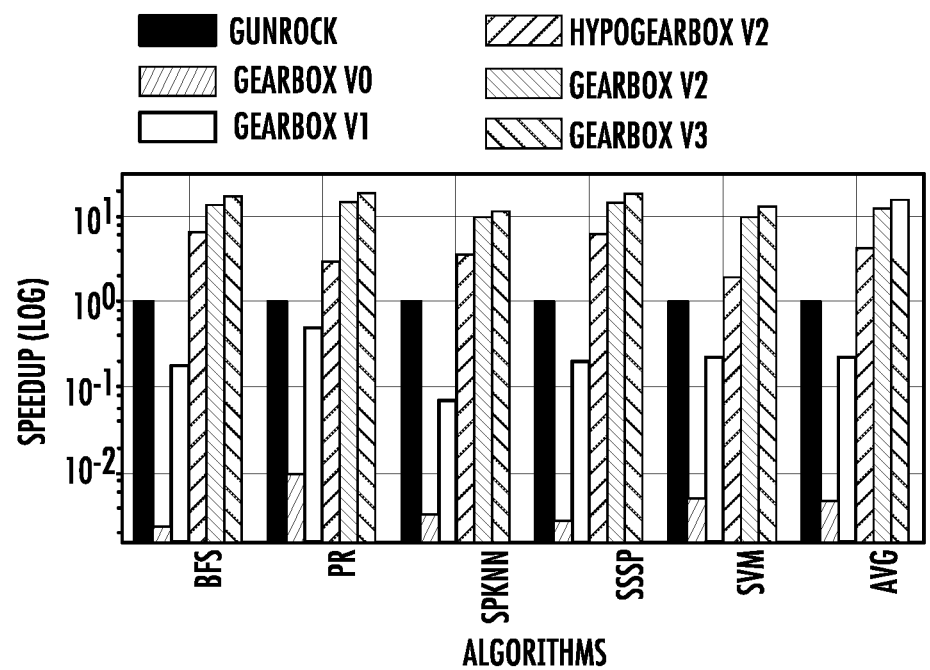
FIG. 13 is a graph that illustrates the effect of each optimization in some embodiments according to present invention.

FIG. 13 illustrates the effect of the proposed optimizations in Gearbox. Table 4 lists the description of each version. GearboxV0 is in fact Fulcrum+local indirect access. Although Fulcrum provided a speedup for SPMV, the density of the matrix evaluated in Fulcrum is 20%, whereas the density of the evaluated matrix in Gearbox is less than 0.001% (Table 3). FIG. 13 shows that, for this density range, GearboxV0 and GearboxV1 are three orders of magnitude and two orders of magnitude slower than Gunrock, respectively. Another version of Gearbox, HypoGearboxV2, which places the entire input and output array in the logic layer, provides, on average, 4.28× speedup compared to GPU. GearboxV2, on average, provides 12.48× speedup over GPU by placing only long activating entries of the output/input vectors in the logic layer. The SRAM capacity for this solution is (2*×(4+4)*/100, where n is the number of rows and P is the percentage of input/out entries placed in the logic layer. For the evaluated datasets and of 0.01%, 34 KB SRAM was used in total in the logic layer.

TABLE 4

Each Gearbox version shown in FIG. 13.

| | Description |
|---|---|
| Gearbox V0 | row-oriented processing + local random access for accessing a row + broadcasting the frontier + using sequential index matching for processing each row |
| Gearbox V1 | column-oriented processing + column-oriented partitioning + our proposed Accumulation dispatching |
| HypoGearboxV2 | column-oriented processing + our Accumulation dispatching + an impractical partitioning (partitioning the matrix with Hybrid partitioning but placing the entire input and output array in the logic layer) |
| Gearbox V2 | column-oriented processing + Accumulation dispatching + Hybrid partitioning without replication long activating entries in each subarray |
| Gearbox V3 | column-oriented processing + reduction dispatching + Hybrid partitioning + replicating long activating entries |

7.4 Execution Time and Energy Breakdown

Figure 14A:
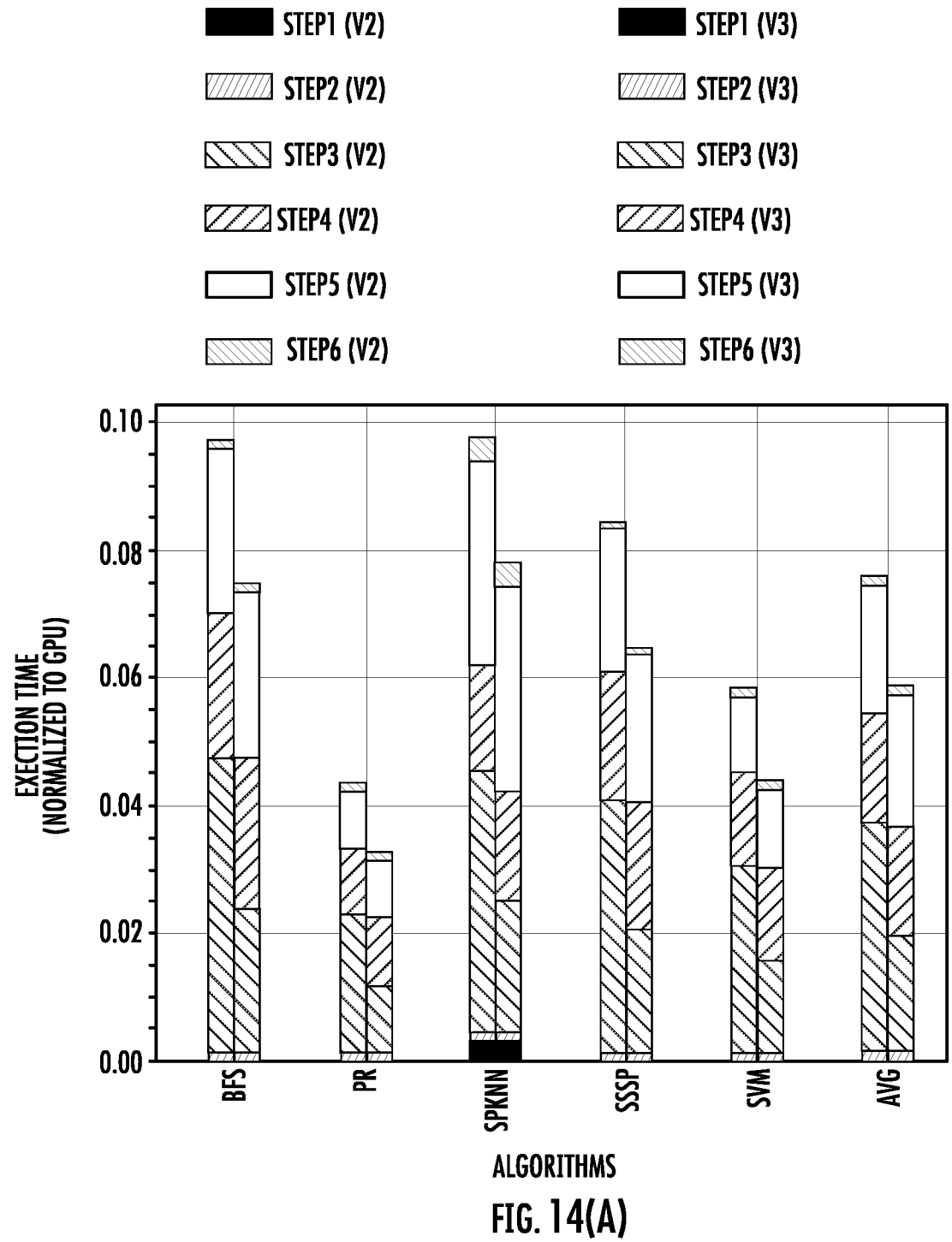
FIG. 14(a) is a graph that illustrates execution time breakdown in some embodiments according to present invention.

FIG. 14(a) shows the breakdown of execution time spent on each of the six steps of the algorithm for GearboxV2 and GearboxV3. Here, most of the execution time is spent on LocalAccumulations and RemoteAccumulations. Step 1 in this figure includes the overhead of broadcasting of non-zero entries placed in the logic layer, which is on average 1.1% of the total execution time.

Figure 14B:
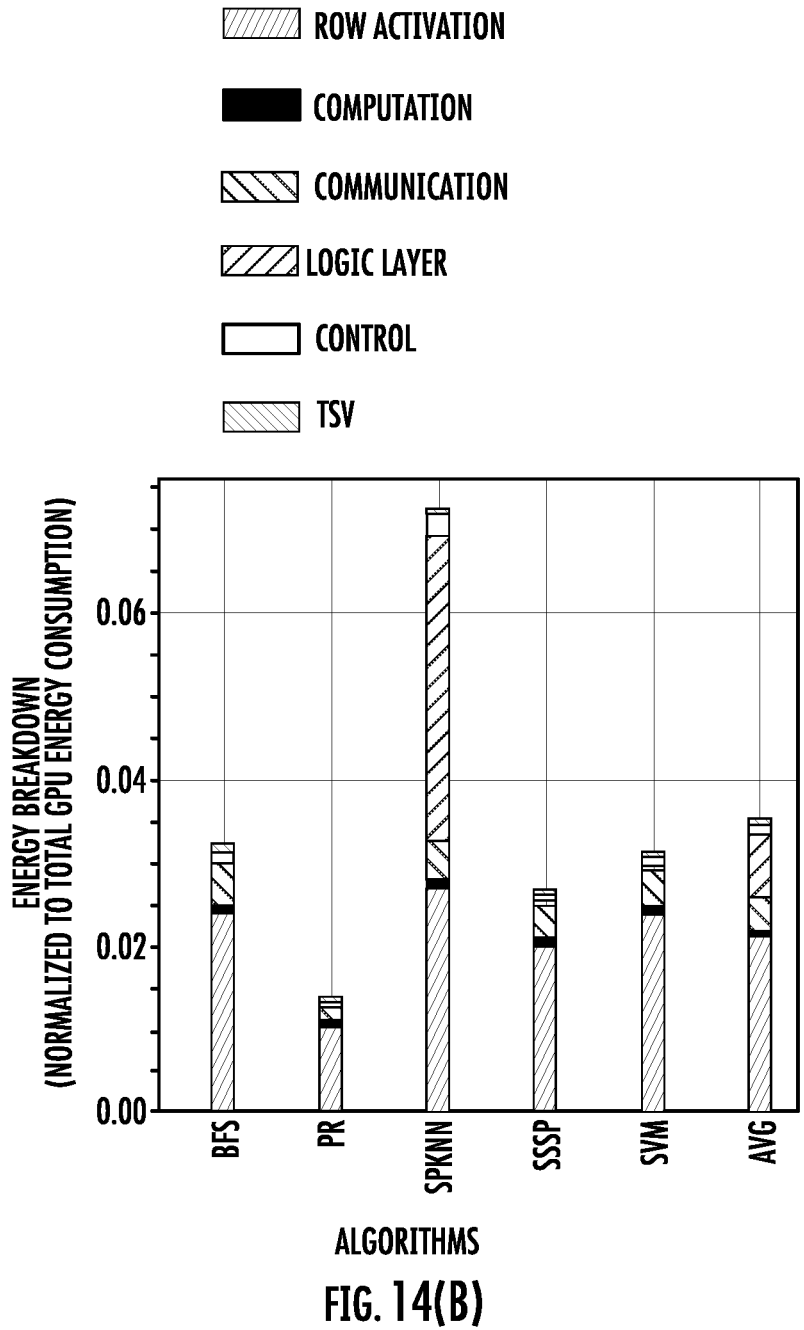
FIG. 14(b) is a graph that illustrates energy breakdown in some embodiments according to present invention.

FIG. 14(b) presents the breakdown of the energy consumption of Gearbox, demonstrating that Gearbox reduces the energy consumption, compared to GPU, on average (up to) by 97 (99)%. This figure shows that in most applications, row activations are the major source of energy consumption. The exception is SPKNN, where the input vector and the output vector have many non-zero values corresponding to the long columns/rows, increasing the energy consumption of the operations in the logic layer.

7.5 Comparison Against Non-In-Memory-Layer Approaches

Figure 15:
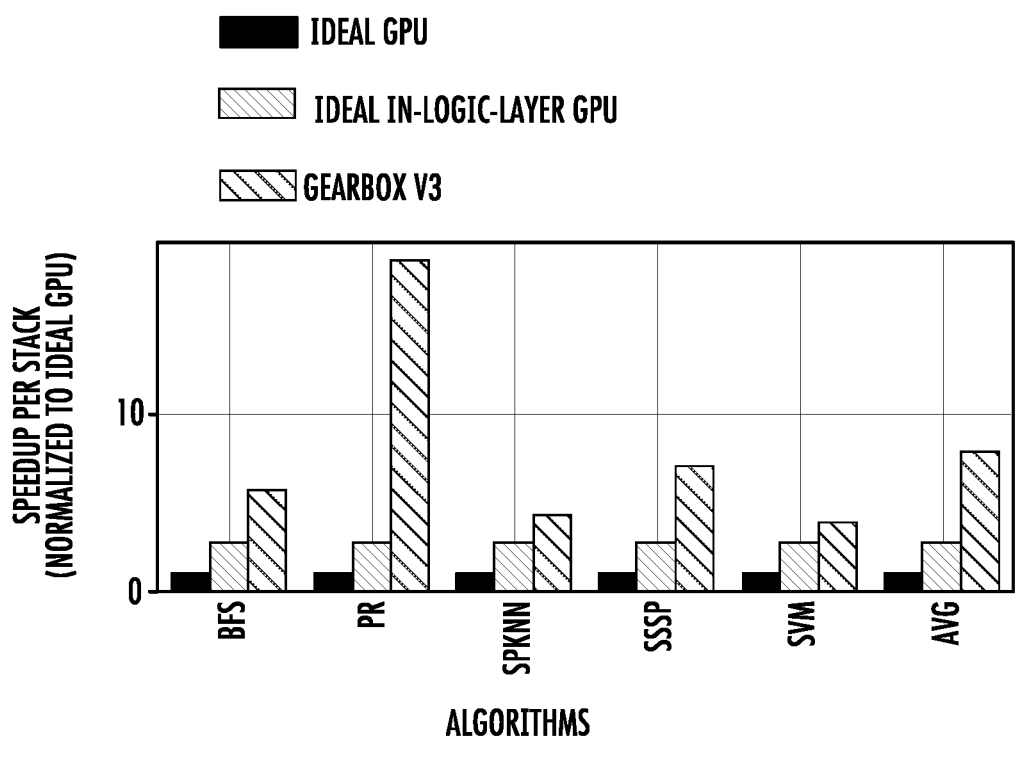
FIG. 15 is a graph that illustrates comparison of Gearbox against other models in some embodiments according to present invention.

FIG. 15 compares the speedup of Gearbox against three ideal models. The ideal models only account for the overhead of data movement and provide an upper bound for non-in-memory-layer approaches. FIG. 15 shows that Gearbox provides 7.94× (31×), on average (up to), speedup per memory stack, compared to the ideal model of a GPU. We also evaluated Gearbox against a purely in-logic-layer approach under aggressive assumptions such as (i) 512 GB/s raw bandwidth, (ii) having enough parallelism to utilize the raw bandwidth, and (iii) having 56 64 kB L1 and 4 MB L2 cache to capture any locality.

Gearbox offers, on average (up to), 2.83× (11×) speedup per memory stack, compared to this ideal model of an in-logic-layer GPU. The main bottleneck of in-logic-layer approaches is the limited bandwidth in the logic layer, which is 29× lower than the bandwidth of in-memory layers. Table 5 compares Gearbox against a few non-in-memory layer approaches based on the reported speedup in their paper on the two common algorithms evaluated by all these accelerators (Page Rank and SSSP). T Tesseract and GraphP in Table 5 use HMC-like configuration. Embodiments according to the invention against these approaches shows that speedup comes from Gearbox's in-memory-layer design and not from using HMC-like configuration. Gearbox's speedup against these approaches also proves that Gearbox can outperform GPUs with Fine-Grained DRAM, with narrow, dedicated TSVs to each bank, similar to HMC.

by the synthesizer, scaled to 22 nm. Pessimistic area evaluation is the maximum of scaling the optimistic area for 4 layers and the pessimistic area reported by the synthesizer. For Walkers, the area was evaluated using CACTI-3DD, which is equivalent to pessimistic area evaluations. Gearbox optimistically (pessimistically) imposes 2.42% (10.93)% area overhead compared to Fulcrum. In comparison with regular HMC memory, Gearbox optimistically (pessimistically) imposes 73% (100)% area overhead.

TABLE 6

Area evaluation of Gearbox

| | Per two subarrays (Area mm$^2$) | | Per Layer | |
|---|---|---|---|---|
| Component | Optimistic | Pessimistic | Optimistic | Pessimistic |
| Original DRAM | — | — | — | 34.95 |
| Walkers | — | 0.011 | 0 | 11.26 |
| Bank-level logic and interconnection | — | — | — | 4.56 |
| Integer SPUs | 0.0067 | 0.010 | 6.86 | 10.42 |
| Float SPUs | 0.0098 | 0.019 | 10.03 | 19.45 |

TABLE 5

Speedup against non-in-memory-layer approaches.

| | Graphicionado[22] | Tesseract[7] | GraphP[57] |
|---|---|---|---|
| Per stack/chip | 10.01 | 27.08 | 21.99 |
| Per area | — | 13.47 | 10.9 |

7.6 the Effect of Load Balancing

Figure 16A:
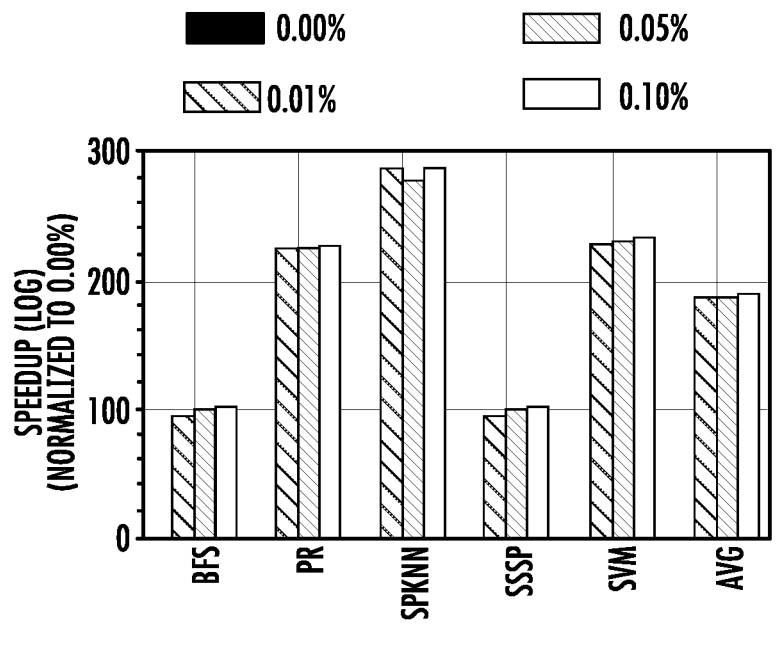
FIG. 16(a) is a graph that illustrates the effect of load balancing for different techniques as a function of percentage of long rows/columns in some embodiments according to present invention.

FIG. 16(a) shows that for most datasets and algorithms, labeling 0.01% of rows/columns as long can significantly improve performance. This figure also shows that increasing the percentage only slightly improves the performance.

Figure 16B:
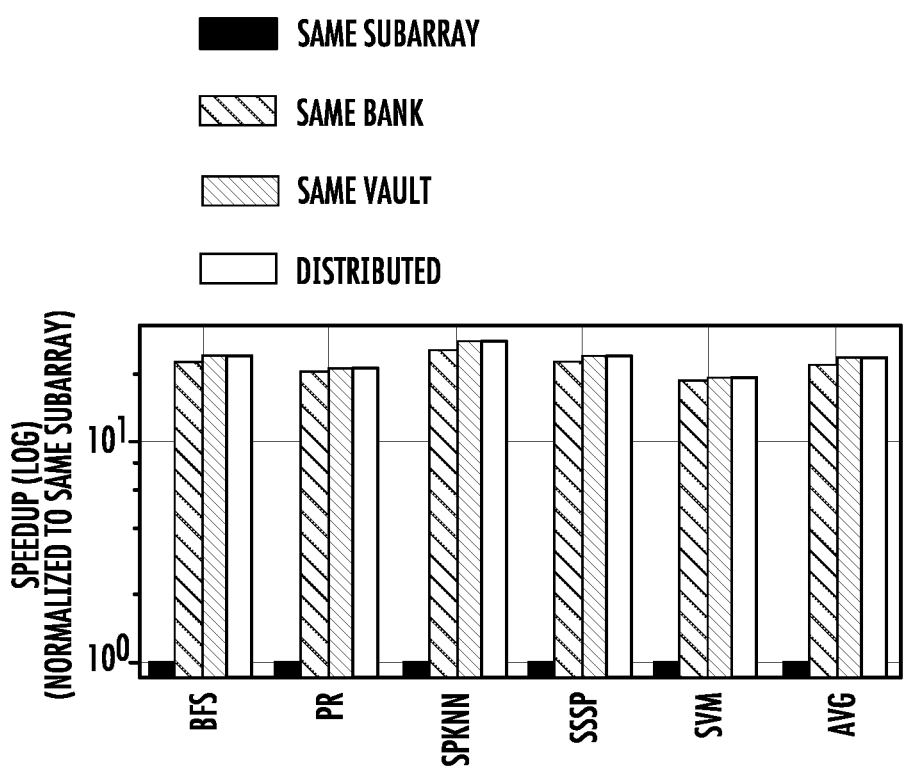
FIG. 16(b) is a graph that illustrates the effect of load balancing for different techniques as a function of consecutive columns in some embodiments according to present invention.

The effect of distributing consecutive columns was also evaluated (FIG. 16) (b). In real-world matrices, consecutive columns (e.g., neighboring nodes in a graph) are most likely to get activated together. Evaluations show that distributing consecutive columns among subarrays in a bank (SameBank) provides, on average (up to), 22.3× (76.9×) speedup compared to storing consecutive columns in the same subarray (SameSubarray).

7.7 Power and Temperature Constraints

Figure 17A:
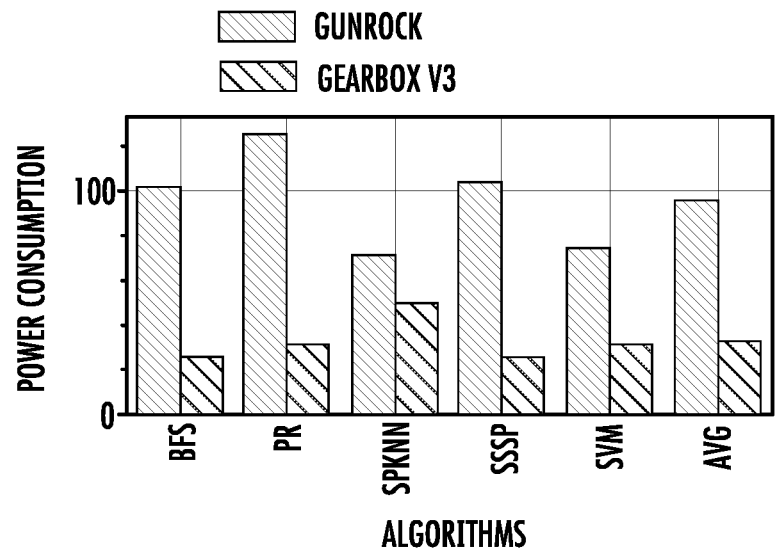
FIG. 17(a) is a graph that illustrates power consumption for different techniques against Gearbox in some embodiments according to present invention.
Figure 17B:
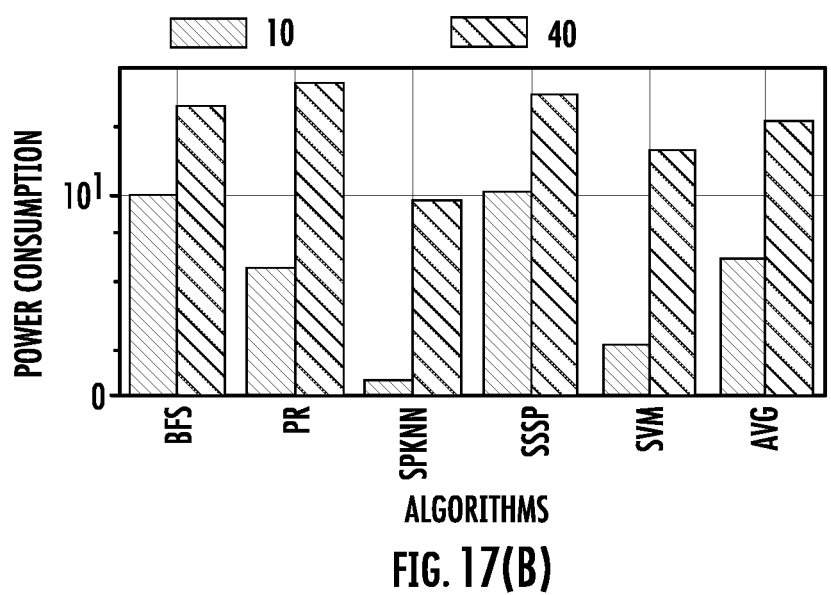
FIG. 17(b) is a graph that illustrates temperature constraints for different techniques against Gearbox in some embodiments according to present invention.

FIG. 17(a) shows that Gearbox reduces power consumption by 75%, compared to the GPU. Gearbox's power density was 465 mW/mm2, which reduced the power density of SpaceA by 12% and is safely under the power density budget of a PIM-based accelerator with a commodity-server active heat sink and under the power budget of the PCIe/CXL peripheral interface. The performance of Gearbox was evaluated under two power budgets: (i) 10 W and (ii) 40 W. FIG. 17(b) presents the speedup of Gearbox under these two power budgets. To lower the power consumption, the frequency was reduced. This figure shows that even under a restricted power budget of 10 watts, Gearbox (with one memory stack) outperformed a high-performance GPU (with three memory stacks), on average (up to) by 6.8× (38.65×).

7.8 Area Evaluation

Figure 18:
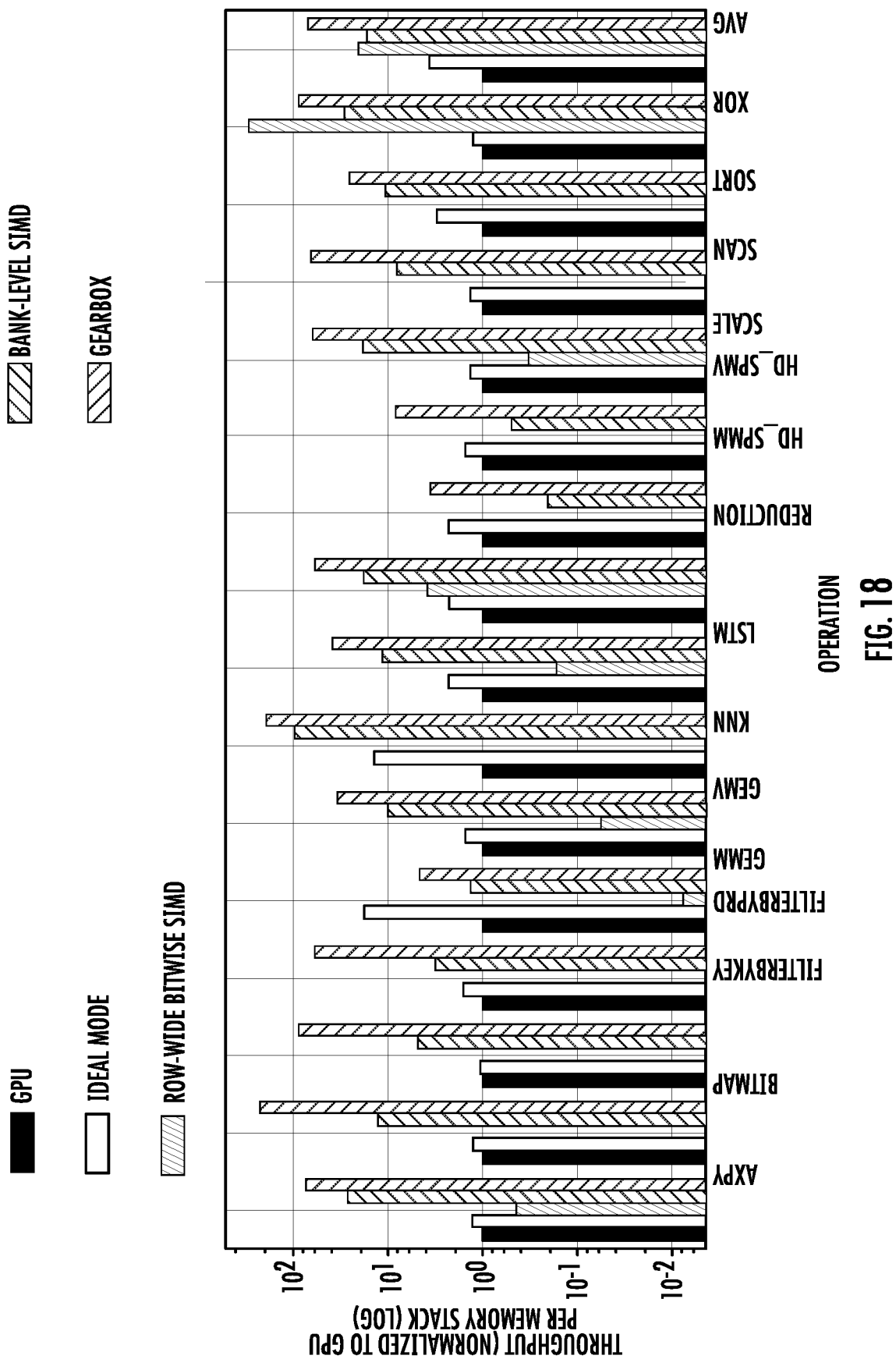
FIG. 18 is a graph that illustrates performance comparison of Gearbox to other techniques as speedup for regular kernels in some embodiments according to present invention.

Table 6 lists the optimistic and pessimistic areas of our hardware components. Optimistic area numbers are reported 7.9 Evaluation for Regular Kernels GearBox (via inclusion of Fulcrum) can also support and speed up regular workloads. FIG. 18 evaluates performance for a range of regular applications from the InSituBench suit. For these evaluations, both Gearbox/Fulcrum and our bank-level SIMD had the same number of ALUs and have the same frequency.

Gearbox provided, on average, 4.4× higher throughput than the bank-level SIMID approach. Gearbox also outperformed DRISA, a row-wide bitwise-based SIMD approach, which implements arithmetic operations using bit-wise operations on horizontally laid-out data, by more than two orders of magnitude. SIMDRAM, another row-wide bitwise-based SIMD approach that implements arithmetic orations on vertically laid out data, cannot support floating-point operations of the evaluated applications. The vertical layout is also highly inefficient for random accesses, as 32 rows would be activated to access a single 32-bit word, one bit per row (the rest of bits in all rows are not used).

Terminology

Any or all of the features and functions described above can be combined with each other, except to the extent it may be otherwise stated above or to the extent that any such embodiments may be incompatible by virtue of their function or structure, as will be apparent to persons of ordinary skill in the art. Unless contrary to physical possibility, it is envisioned that the methods/steps described herein may be performed in any sequence and/or in any combination, and the components of respective embodiments may be combined in any manner.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims, and other equivalent features and acts are intended to be within the scope of the claims.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Unless the context clearly requires otherwise, throughout the description and the claims, the words "comprise," "comprising," and the like are to be construed in an inclusive sense, as opposed to an exclusive or exhaustive sense, e.g., in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words using the singular or plural number may also include the plural or singular number, respectively. The word "or" in reference to a list of two or more items, covers all of the following interpretations of the word: any one of the items in the list, all of the items in the list, and any combination of the items in the list. Likewise, the term "and/or" in reference to a list of two or more items, covers all of the following interpretations of the word: any one of the items in the list, all of the items in the list, and any combination of the items in the list.

Conjunctive language such as the phrase "at least one of X, Y and Z," unless specifically stated otherwise, is otherwise understood with the context as used in general to convey that an item, term, etc. may be either X, Y or Z, or any combination thereof. Thus, such conjunctive language is not generally intended to imply that certain embodiments require at least one of X, at least one of Y and at least one of Z to each be present. Further, use of the phrase "at least one of X, Y or Z" as used in general is to convey that an item, term, etc. may be either X, Y or Z, or any combination thereof.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount.

Any patents and applications and other references noted above, including any that may be listed in accompanying filing papers, are incorporated herein by reference. Aspects of the invention can be modified, if necessary, to employ the systems, functions, and concepts of the various references described above to provide yet further implementations of the invention. These and other changes can be made to the invention in light of the above Detailed Description. While the above description describes certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

To reduce the number of claims, certain aspects of the invention are presented below in certain claim forms, but the applicant contemplates other aspects of the invention in any number of claim forms. Any claims intended to be treated under 35 U.S.C. § 112(f) will begin with the words "means for," but use of the term "for" in any other context is not intended to invoke treatment under 35 U.S.C. § 112(f). Accordingly, the applicant reserves the right to pursue additional claims after filing this application, in either this application or in a continuing application.

What is claimed:

1. An integrated circuit memory device comprising:
   a plurality of banks of memory, each of the banks of memory including:
   a first pair of sub-arrays comprising first and second sub-arrays, the first pair of sub-arrays configured to store data in memory cells of the first pair of sub-arrays;
   a first row buffer memory circuit located in the integrated circuit memory device adjacent to the first pair of sub-arrays and configured to store first row data received from the first pair of sub-arrays and configured to transfer the first row data into and/or out of the first row buffer memory circuit; and
   a first sub-array level processor circuit in the integrated circuit memory device adjacent to the first pair of sub-arrays and operatively coupled to the first row data, wherein the first sub-array level processor circuit is configured to perform column oriented processing a sparse matrix kernel stored, at least in-part, in the first pair of sub-arrays, with input vector values stored, at least in part, in the first pair of sub-arrays to provide output vector values representing products of values stored in columns of the sparse matrix kernel with the input vector values.

2. The integrated circuit memory device of claim 1 wherein the values in long columns of the sparse matrix kernel and the output vector values representing accumulated values of the values in the long columns activated by the input vector values, are partitioned within the memory device so that both are stored in the same sub-array of the memory.

3. The integrated circuit memory device of claim 2 wherein short columns of the sparse matrix kernel are not partitioned within the memory device so that both are stored in the same sub-array of the memory.

4. The integrated circuit memory device of claim 2 wherein accumulation operations for the values in the long columns activated by the input vector values partitioned within the same sub-array comprise local accumulations and wherein the accumulation operations for the values in the long columns activated by the input vector values not partitioned within the same sub-array comprise local accumulations comprise remote accumulations.

5. The integrated circuit memory device of claim 4 further comprising:
a pair of dispatch sub-arrays configured to store remote accumulations to be dispatched to a remote level processor circuit including a remote sub-array level processor circuit for accumulation;
a dispatch sub-array level processor circuit operatively coupled to the pair of dispatch sub-arrays and configured to dispatch the remote accumulations from the pair of dispatch sub-arrays to the remote sub-array level processor circuit for accumulation responsive to an indication that the remote sub-array level processor circuit is idle.

6. The integrated circuit memory device of claim 5 further comprising:
indexing registers configured to represent an index value for the sparse matrix kernel beyond which accumulation operations are determined to be remote accumulations.

7. The integrated circuit memory device of claim 6 wherein the plurality of banks comprise a plurality of layers in a 3D stack.

8. The integrated circuit memory device of claim 7 wherein at least one layer in the plurality of layers comprises a logic layer configured to store the remote accumulations.

9. The integrated circuit memory device of claim 2 wherein the input vector values that activated the values in the long columns of the sparse matrix kernel are stored in the first sub-array of the memory.

10. The integrated circuit memory device of claim 7 further comprising:
a through-via extending through the plurality of layers to electrically couple data to/from the plurality of banks located among the plurality of layers.

11. The integrated circuit memory device of claim 1 wherein the first sub-array level processor circuit includes:
a control circuit operatively coupled to the first pair of sub-arrays, to the first row buffer memory circuit, and to the first sub-array level processor circuit and configured to select inputs to first and second inputs to the first sub-array level processor circuit and to provide instruction an ALU circuit included in the control circuit to operate on data in the first row buffer memory circuit.

12. The integrated circuit memory device of claim 1 wherein the first sub-array level processor circuit is configured to shift row data for the first pair of sub-arrays from or to the first row buffer memory circuit using a hot-one encoded value to randomly access a column of data stored in the first row buffer memory circuit.

13. An integrated circuit memory device comprising:
a sub-array level processor circuit in the integrated circuit memory device located adjacent to a pair of sub-arrays of the memory device and configured to perform column oriented processing on a sparse matrix kernel stored, at least in-part, in the pair of sub-arrays, with input vector values stored, at least in part, in the pair of sub-arrays to provide output vector values representing products of values stored in columns of the sparse matrix kernel with the input vector values.

* * * * *